(12) United States Patent
Hamada

(10) Patent No.: US 6,403,404 B1
(45) Date of Patent: Jun. 11, 2002

(54) METHOD OF SELECTIVELY FORMING A SILICIDE LAYER ON A LOGIC AREA OF A SEMICONDUCTOR SUBSTRATE

(75) Inventor: Masayuki Hamada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/547,229

(22) Filed: Apr. 11, 2000

(30) Foreign Application Priority Data

Apr. 12, 1999 (JP) ............................................. 11-104583

(51) Int. Cl.[7] ................... H01L 21/335; H01L 21/8232
(52) U.S. Cl. ........................................ 438/142; 438/241
(58) Field of Search ............................... 438/142, 195, 438/241, 289, 633, 649, 683, 210, 238, 257, 275

(56) References Cited

U.S. PATENT DOCUMENTS 5,759,889 A * 6/1998 Sakao .......................... 438/241
6,096,595 A * 8/2000 Huang .......................... 438/238
6,146,994 A * 11/2000 Hwang .......................... 438/633
6,159,856 A * 12/2000 Nagano .......................... 438/683

* cited by examiner

Primary Examiner—David Nelms
Assistant Examiner—Phuc T. Dang
(74) Attorney, Agent, or Firm—Young & Thompson

(57) ABSTRACT

The present invention provides a method of selectively forming a silicide layer on a logic region of a semiconductor substrate which has an integration of a memory cell region and the logic region. The method comprises the steps of: forming an insulation film over the memory cell region and the logic region; entirely applying a resist film over the insulation film; selectively removing the resist film over at least a predetermined part of the logic region by use of a lithography process, whereby the insulation film is shown over the logic region; selectively etching the insulation film over the logic region by use of the resist film, whereby at least a silicon region is shown over the logic region; removing the resist film; entirely depositing a refractory metal layer on the insulation film over the memory cell region and also on the silicon region over the logic region; carrying out a heat treatment to cause a silicidation reaction to form at least a silicide layer on the silicon region over the logic region; and removing an unreacted refractory metal layer from the silicon oxide film.

10 Claims, 34 Drawing Sheets

METHOD OF SELECTIVELY FORMING A SILICIDE LAYER ON A LOGIC AREA OF A SEMICONDUCTOR SUBSTRATE

BACKGROUND OF THE INVENTION

The present invention relates to a method of forming a semiconductor device, and more particularly to a method of selectively forming a silicide layer only on a logic area of a semiconductor substrate on which the logic area and a memory area are integrated.

A semiconductor memory device is essential for a large scale integrated circuit. The semiconductor memory device is classified into a dynamic random access memory (DRAM) and a static random access memory (SRAM) Those memory devices include many MOS field effect transistors which are advantageous in high density integration. The DRAM is more advantageous than the SRAM in the high density integration to reduce the manufacturing cost, for which reason the DRAM has widely been used in various types storage devices for information devices.

The DRAM store any informations or data by utilizing capacitors provided therein, the informations or data are stored as charges in the capacitors. Realization of the high density integration of the DRAM needs to reduce an occupied area of the storage capacitor over the semiconductor substrate. The reduction in occupied area of the storage capacitor makes it necessary to modify or improve the structure of the storage capacitor in order to keep the capacity.

The DRAM has a memory cell structure having a plurality of cells, each of which comprises a pair of a switching transistor and a capacitor. The switching transistor is provided for selecting the memory cell or controlling input and output of informations into and from the capacitor. This switching transistor comprises the MOS field effect transistor. The DRAM also has a peripheral circuit which performs logic operations to control the memory cells for write operations, read operations and erasing operations. The peripheral circuit comprise logic circuits which further comprise the MOS field effect transistors and complementary MOS field effect transistors. As described above, the DRAM has an integration of the memory cell area having an alignment of the memory cells and the logic area having the logic circuits. In recent years, it is required to integrate the DRAM and a large scale logic device such as a processor over the same semiconductor substrate.

In order to improve a high speed performance of the semiconductor device, it is essential to reduce a sheet resistance and a contact resistance of diffusion layers in an active region of the MOS field effect transistor in the logic area. In order to reduce the sheet resistance and the contact resistance, it is effective to form silicide layers on surfaces of the diffusion layers of the MOS field effect transistors. The memory cell area is quite different from the logic area. The memory cell area needs to prevent any junction leakage current through the diffusion layers of the MOS field effect transistors in the memory cell area, for which purpose no silicide layer is formed over surfaces of the diffusion layers of the MOS field effect transistors. Namely, it is required that the silicide layers are formed on surfaces of the diffusion layers of the MOS field effect transistors provided in the logic area whilst no silicide layers are formed in the memory cell area. Accordingly, it is required to selectively form the silicide layers only in the logic area.

In Japanese laid-open patent publication No. 1-264257, it is disclosed that silicide layers are selectively formed on the logic area of the DRAM. FIGS. 1A through 1C are fragmentary cross sectional elevation views illustrative of semiconductor substrates in sequential steps involved in a conventional method of selectively forming silicide layers on a logic area of a DRAM which has an integration of the logic area and a memory cell area.

With reference to FIG. 1A, field oxide films 72 as isolations are selectively formed on a surface of a p-type silicon substrate 71 by either a local oxidation of silicon or a shallow trench isolation method, so that the field oxide films 72 define active regions, for example, memory cell regions 80 and logic regions 90. Gate oxide films 77 are selectively formed on the memory cell regions 80 and the logic regions 90. Gate electrodes 78 arc formed oil the gate oxide films 77 over the memory cell regions 80 and the logic regions 90. Silicon nitride films 79 are formed on the gate electrodes 78. N-⁻type lightly doped regions are formed by self-aligned technique by use of the gate electrodes 78 and the silicon nitride films 79 as masks. Side wall oxide films 81 are formed on side walls of each of the gate electrodes 78 and the silicon nitride films 79. N-⁺type source and drain regions 73A and 74A are selectively formed in the memory cell region 80 by self-aligned technique using the gate electrodes 78 and the silicon nitride films 79 as well as the side wall oxide films 81 as masks, whereby the N-⁺type source and drain regions 73A and 74A define N-⁻type lightly doped regions 73B and 74B. Also N-⁺type source and drain regions 75A and 76A are selectively formed in the logic region 90 by self-aligned technique using the gate electrodes 78 and the silicon nitride films 79 as well as the side wall oxide films 81 as masks, whereby the N-⁺type source and drain regions 75A and 76A define N-⁻type lightly doped regions 75B and 76B. Namely, source and drain regions 73 and 74 having the lightly doped drain structure are formed in the memory cell region 80, whilst source and drain regions 75 and 76 having the lightly doped drain structure are formed in the logic region 90.

With reference to FIG 1B, a photo-resist film 82 is entirely formed over the memory cell region 80 and the logic region 90 of the p-type silicon substrate 71. The photo-resist film 82 is then subjected to photo-lithography processes using a photo-mask wherein an exposure and a subsequent development are carried out to selectively remove the photoresist film 82, so that the logic region 90 is shown. Namely, the gate oxide film 77, the side wall oxide films 81 and the silicon nitride film 97 are shown. Further, the gate oxide film 77 over the N-⁺type source and drain regions 75A and 76A is removed, so that the N-⁺type source and drain regions 75A and 76A are shown. The silicon nitride film 79 is also removed so that the gate electrode 78 is shown.

With reference to FIG. 1C, a refractory metal film is entirely deposited by a sputtering method, so that the refractory metal film extends over the photo-resist film 82 and over the N-⁺type source and drain regions 75A and 76A, the side wall oxide films 81 and the gate electrode 78. The refractory metal film may be made of a refractory metal such as tungsten, molybdenum, and titanium. The substrate 71 is then subjected to a heat treatment to cause silicidation reaction between refractory metal in the refractory metal film and silicon in the N-⁺type source and drain regions 75A and 76A and the gate electrode 78, thereby forming silicide layers 83 over the N-⁺type source and drain regions 75A and 76A and the gate electrode 78. Unreacted refractory metal film remain over the side wall oxide films 81 and the photo-resist film 82. The unreacted refractory metal film is removed by an etching process.

As described above, the conventional method selectively forms the silicide layers only on the logic region 90. It is also possible to form the CMOS transistor in the logic region 90 if necessary.

The above described conventional method has the following problems. It is required to carry out an additional photo-lithography process whereby the gate oxide film 77 selectively removed and the silicon nitride film 79 is removed, so that the N-+type source and drain regions 75A and 76A as well as the gate electrode 78 are shown before the refractory metal film is deposited. This additional photo-lithography process results in increase of the manufacturing cost.

In the above circumstances, it had been required to develop a novel method of selectively forming silicide layers only in a logic region of a semiconductor substrate which has an integration of a memory cell region and the logic region, wherein the method is free from the above problem.

SUMMARY OF THE INVENTION

Accordingly, it is an object of the present invention to provide a novel method of selectively forming silicide layers only in a logic region of a semiconductor substrate which has an integration of a memory cell region and the logic region, wherein the method is free from the above problems.

It is a further object of the present invention to provide a novel method of selectively forming silicide layers only in a logic region of a semiconductor substrate which has an integration of a memory cell region and the logic region, wherein the method is free of the above additional photo-lithography process.

It is a still further object of the present invention to provide a novel method of selectively forming silicide layers only in a logic region of a semiconductor substrate which has an integration of a memory cell region and the logic region, wherein the method allows a reduction of the manufacturing cost for the semiconductor device such as DRAM.

The present invention provides a method of selectively forming a silicide layer on a logic region of a semiconductor substrate which has an integration of a memory cell region and the logic region. The method comprises the steps of: forming an insulation film over the memory cell region and the logic region; entirely applying a resist film over the insulation film; selectively removing the resist film over at least a predetermined part of the logic region by use of a lithography process, whereby the insulation film is shown over the logic region; selectively etching the insulation film over the logic region by use of the resist film, whereby at least a silicon region is shown over the logic region; removing the resist film; entirely depositing a refractory metal layer on the insulation film over the memory cell region and also on the silicon region over the logic region; carrying out a heat treatment to cause a silicidation reaction to form at least a silicide layer on the silicon region over the logic region; and removing an unreacted refractory metal layer from the silicon oxide film.

The present invention also provides a method of forming a semiconductor device which has an integration of a memory cell region and a logic region having at least a silicide layer. The method comprises the steps of: defining at least a memory cell region and at least a logic region over a silicon substrate; forming gate insulation films on the at least memory cell region and the at least logic region; forming a first gate electrode on the gate insulation film over the memory cell region and a second gate electrode on the gate insulation film over the at least logic region; selectively forming first lightly doped regions in the memory cell region in a self-alignment technique by using the first gate electrode as a mask, and also selectively forming second lightly doped regions in the logic region in a self-alignment technique by using the second gate electrode as a mask; entirely forming an insulation film over the at least memory cell region and the at least logic region; entirely applying a resist film over the insulation film; selectively removing the resist film over at least a predetermined pat of the logic region by use of a lithography process, whereby the insulation film is shown over the logic region subjecting the insulation film over the logic region to an etch-back process by use of the resist film, whereby side wall insulation films are formed on side walls of the second gate electrode over the logic region and the second lightly doped regions are shown over the logic region; selectively forming source and drain regions having a lightly-doped drain structure in the logic regions in a self-alignment technique using the resist film and the second gate electrode as masks; removing the resist film; entirely depositing a refractory metal layer on the insulation film over the memory cell region and also on the source and drain regions over the logic region; carrying out a heat treatment to cause a silicidation reaction to form silicide layers on the source and drain regions over the logic region; and removing an unreacted refractory metal layer from the silicon oxide film.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
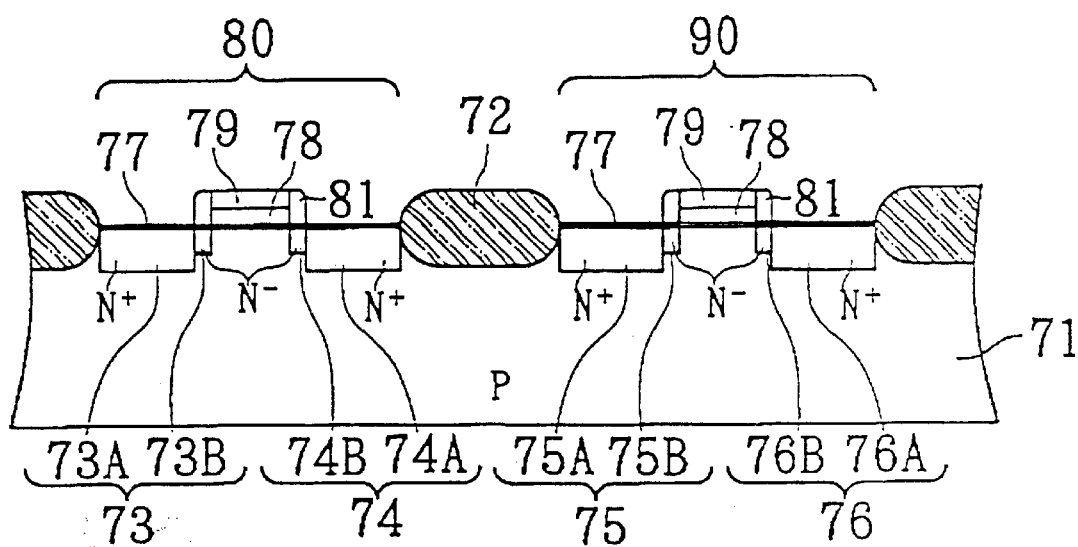
FIGS. 1A through 1C are fragmentary cross sectional elevation views illustrative of semiconductor substrates in sequential steps involved in a conventional method of selectively forming silicide layers on a logic area of a DRAM which has an integration of the logic area and a memory cell area.
Figure 1B:
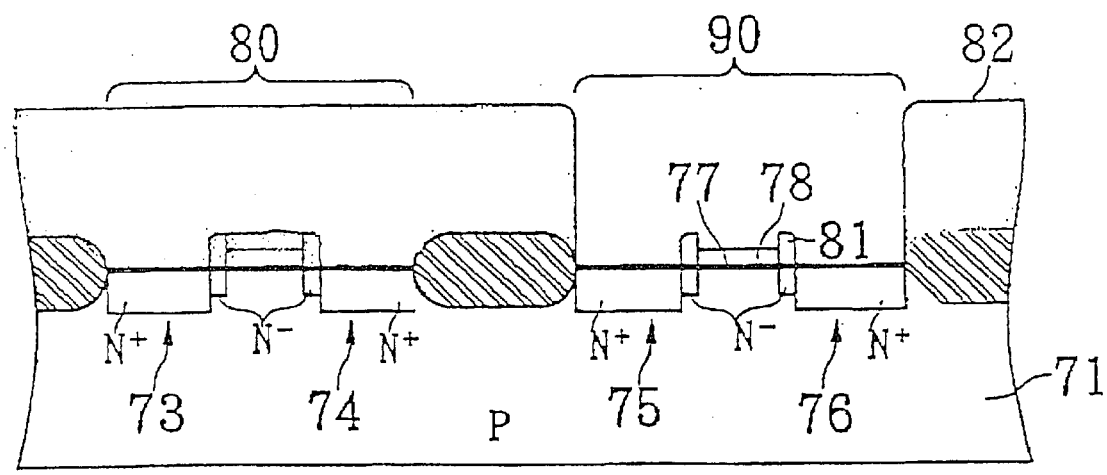
Figure 1C:
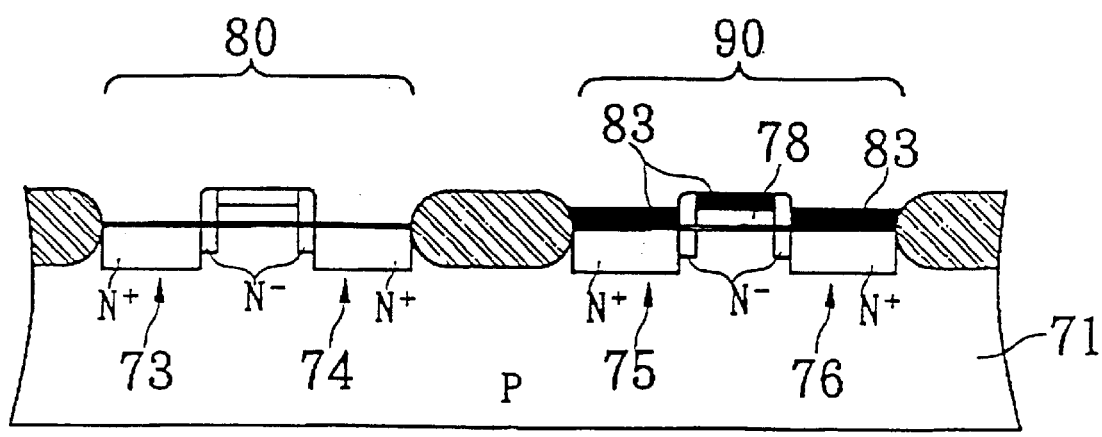

The present invention provides a method of selectively forming a silicide layer on a logic region of a semiconductor substrate which has an integration of a memory cell region and the logic region. The method comprises the steps of: forming an insulation film over the memory cell region and the logic region; entirely applying a resist film over the insulation film; selectively removing the resist film over at least a predetermined part of the logic region by use of a lithography process, whereby the insulation film is shown over the logic region; selectively etching the insulation film over the logic region by use of the resist film, whereby at least a silicon region is shown over the logic region; removing the resist film; entirely depositing a refractory metal layer on the insulation film over the memory cell region and also on the silicon region over the logic region; carrying out a heat treatment to cause a silicidation reaction to form at least a suicide layer on the silicon region over the logic region; and removing an unreacted refractory metal layer from the silicon oxide film.

It is possible that the step of selectively etching the insulation film over the logic region by use of the resist film comprises an etch back by use of the resist film to form side wall insulation films on side walls of a gate electrode over the logic region.

It is further possible that the at least silicon region being made shown by the etch back comprises source and drain regions having a lightly doped drain structure over the logic region.

It is further more possible that the source and drain regions are self-aligned by the gate electrode and the side wall insulation films, and the silicide layer has a salicide structure.

It is also possible that the logic region comprises at least a first conductivity type channel region and at least a second conductivity type channel region, and the method comprises the steps of: forming an insulation film over the memory cell region and the first conductivity type channel region and the second conductivity type channel region; entirely applying a first resist film over the insulation film; selectively removing the first resist film over at least a predetermined part of the first conductivity type channel region by use of a first lithography process, whereby the insulation film is shown over the first conductivity type channel region; selectively etching the insulation film over the first conductivity type channel region by use of the first resist film, whereby at least a first silicon region is shown over the first conductivity type channel region; removing the first resist film; entirely applying a second resist film over the insulation film; selectively removing the second resist film over at least a predetermined part of the second conductivity type channel region by use of a second lithography process, whereby the insulation film is shown over the second conductivity type channel region; selectively etching the insulation film over the second conductivity type channel region by use of the second resist film, whereby at least a second silicon region is shown over the second conductivity type channel region removing the second resist film; entirely depositing a refractory metal layer on the insulation film over the memory cell region and also on the first and second silicon regions over the first conductivity type channel region and the second conductivity type channel region; carrying out a heat treatment to cause a silicidation reaction to form silicide layers on the first and second silicon regions over the first conductivity type channel region and the second conductivity type channel region; and removing an unreacted refractory metal layer from the silicon oxide film.

It is possible that the step of selectively etching the insulation film over the first conductivity type channel region by use of the first resist film comprises a first etch back process by use of the first resist film to form first side wall insulation films on side walls of a first gate electrode over the first conductivity type channel region, and the step of selectively etching the insulation film over the second conductivity type channel region by use of the second resist film comprises a second etch back process by use of the second resist film to form second side wall insulation films on side walls of a second gate electrode over the second conductivity type channel region.

It is further possible that the at least first silicon region being made shown by the first etch back process comprises first source and drain regions having a lightly doped drain structure over the first conductivity type channel region, and the at least second silicon region being made shown by the second etch back process comprises second source and drain regions having a lightly doped drain structure over the second conductivity type channel region.

It is further more possible that the first source and drain regions are self-aligned by the first gate electrode and the first side wall insulation films, and the second source and drain regions are self-aligned by the second gate electrode and the second side wall insulation films, whereby the silicide layers have a salicide structure.

The present invention also provides a method of forming a semiconductor device which has an integration of a memory cell region and a logic region having at least a silicide layer. The method comprises the steps of: defining at least a memory cell region and at least a logic region over a silicon substrate; forming gate insulation films on the at least memory cell region and the at least logic region; forming a first gate electrode on the gate insulation film over the memory cell region and a second gate electrode on the gate insulation film over the at least logic region; selectively forming first lightly doped regions in the memory cell region in a self-alignment technique by using the first gate electrode as a mask, and also selectively forming second lightly doped regions in the logic region in a self-alignment technique by using the second gate electrode as a mask; entirely forming an insulation film over the at least memory cell region and the at least logic region; entirely applying a resist film over the insulation film; selectively removing the resist film over at least a predetermined part of the logic region by use of a lithography process, whereby the insulation film is shown over the logic region; subjecting the insulation film over the logic region to an etch-back process by use of the resist film, whereby side wall insulation films are formed on side walls of the second gate electrode over the logic region and the second lightly doped regions are shown over the logic region; selectively forming source and drain regions having a lightly-doped drain structure in the logic regions in a self-alignment technique using the resist film and the second gate electrode as masks; removing the resist film; entirely depositing a refractory metal layer on the insulation film over the memory cell region and also on the source and drain regions over the logic region; carrying out a heat treatment to cause a silicidation reaction to form silicide layers on the source and drain regions over the logic region; and removing an unreacted refractory metal layer from the silicon oxide film.

It is possible that the logic region comprises at least a first conductivity type channel region and at least a second conductivity type channel region, and the method comprises the steps of: defining the memory cell region and a first conductivity type channel region and a second conductivity type channel region of the logic region over a silicon substrate; forming gate insulation films on the memory cell region and the first conductivity type channel region and the second conductivity type channel region; forming a first gate electrode on the gate insulation film over the memory cell region and a second gate electrode on the gate insulation film over the first conductivity type channel region and a third gate electrode on the gate insulation film over the second conductivity type channel region; selectively forming first lightly doped regions in the memory cell region in a self-alignment technique by using the first gate electrode as a mask, and also selectively forming second lightly doped regions in the first conductivity type channel region in a self-alignment technique by using the second gate electrode as a mask, and also selectively forming third lightly doped regions in the second conductivity type channel region in a self-alignment technique by using the third gate electrode as a mask; entirely forming an insulation film over the at least memory cell region and the first conductivity type channel region and the second conductivity type channel region; entirely applying a first resist film over the insulation film; selectively removing the first resist film over at least a predetermined part of the first conductivity type channel region by use of a first lithography process, whereby the insulation film is shown over the first conductivity type channel region; subjecting the insulation film over the first conductivity type channel region to a first etch-back process by use of the first resist film, whereby first side wall insulation films are formed on side walls of the second gate electrode, and the second lightly doped regions are shown over the first conductivity type channel region selectively forming first source and drain regions having a lightly-doped drain structure in the first conductivity type channel region in a self-alignment technique using the first resist film and the second gate electrode as masks; removing the first resist film; entirely applying a second resist film over the insulation film; selectively removing the second resist film over at least a predetermined part of the second conductivity type channel region by use of a second lithography process, whereby the insulation film is shown over the second conductivity type channel region; subjecting the insulation film over the second conductivity type channel region to a second etch-back process by use of the second resist film, whereby second side wall insulation films are formed on side walls of the third gate electrode, and the third lightly doped regions are shown over the second conductivity type channel region; selectively forming second source and drain regions having a lightly-doped drain structure in the second conductivity type channel region in a self-alignment technique using the second resist film and the third gate electrode as masks; removing the second resist film; entirely depositing a refractory metal layer on the insulation film over the memory cell region and also on the first and second source and drain regions over the first conductivity type channel region and the second conductivity type channel region; carrying out a heat treatment to cause a silicidation reaction to form silicide layers on the first and second source and drain regions over the first conductivity type channel region and the second conductivity type channel region; and removing an unreacted refractory metal layer from the silicon oxide film.

Preferred Embodiment
First Embodiment

Figure 2A:
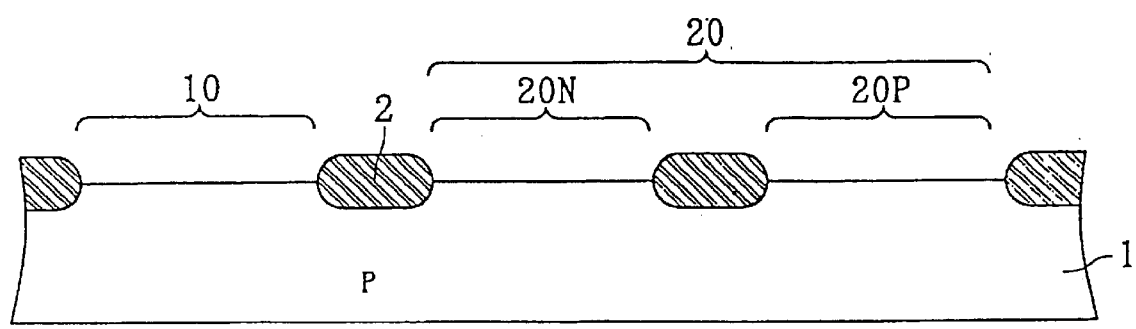
FIGS. 2A through 2O are fragmentary cross sectional elevation views illustrative of semiconductor substrates in sequential steps involved in a novel method of selectively forming silicide layers on a logic area of a DRAM which has an integration of the logic area and a memory cell area in a first embodiment in accordance with the present invention.

A first embodiment according to the present invention will be described in detail with reference to the drawings. FIGS. 2A through 2O are fragmentary cross sectional elevation views illustrative of semiconductor substrates in sequential steps involved in a novel method of selectively forming silicide layers on a logic area of a DRAM which has an integration of the logic area and a memory cell area in a first embodiment in accordance with the present invention.

With reference to FIG. 2A, field oxide films 2 are selectively formed on a surface of a p-type silicon substrate 1 by a local oxidation of silicon method or a shallow trench isolation method, so that the field oxide films 2 define a memory cell region 10 as an active region as well as n-channel and p-channel regions 20N and 20P of a logic region 20. In this embodiment, CMOS transistors are intended to be formed in the logic region 20. Namely, the logic region 20 comprises the n-channel and p-channel regions 20N and 20P.

Figure 2B:
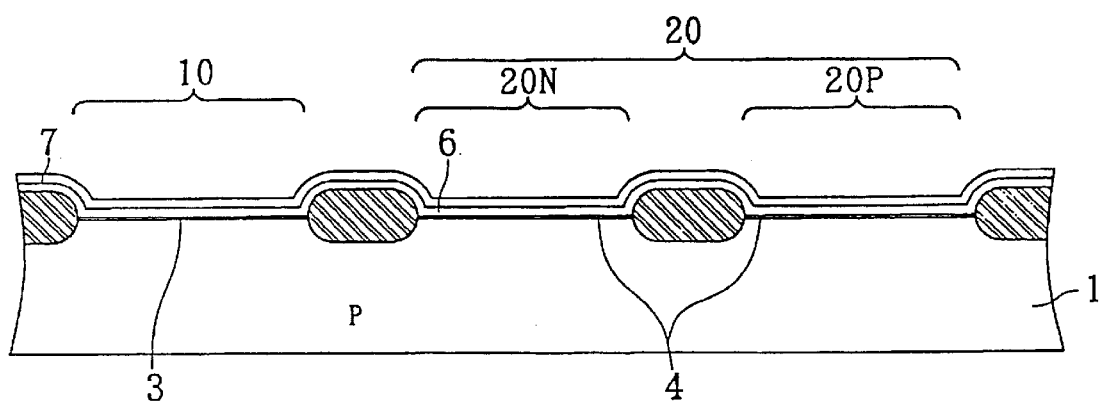

With reference to FIG. 2B, gate oxide films 3 and 4 are formed on the memory cell region 10 and the logic region 20 by a thermal oxidation method, wherein the thermal oxidation method comprises two steps so that the gate oxide films 3 and 4 are different in thickness from each other in order to adjust required different characteristics. The gate oxide film 3 formed on the memory cell region 10 has a thickness in the range of 7–10 nanometers. The gate oxide film 4 formed on the logic region 20 has a thickness in the range of 4–5 nanometers. Subsequently, a polysilicon film 6 is entirely formed by a chemical vapor deposition method, so that the polysilicon film 6 extends over the field oxide films 2 and the gate oxide films 3 and 4. The polysilicon film 6 has a thickness in the range of 90–110 nanometers. A tungsten suicide film 7 is entirely formed by a chemical vapor deposition method, so that the tungsten silicide film 7 extends over the polysilicon film 6. The tungsten silicide film 7 has a thickness in the range of 100–150 nanometers.

Figure 2C:
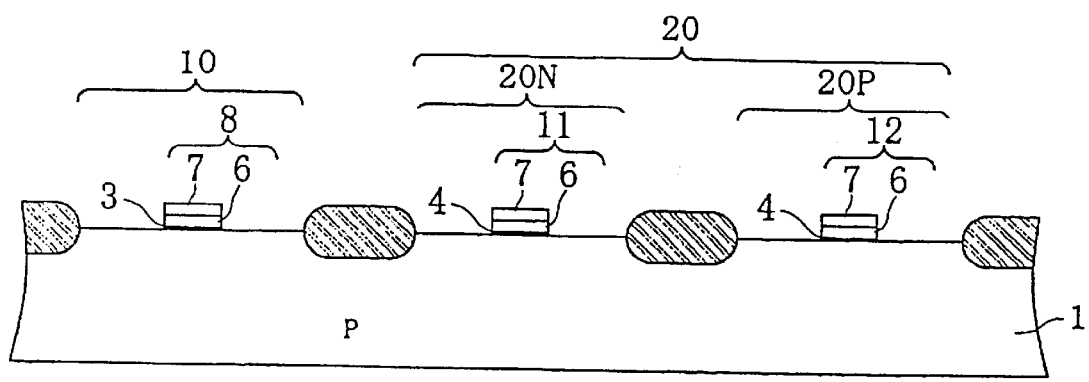

With reference to FIG. 2C, laminations of the polysilicon film 6 and the tungsten silicide film 7 are patterned by a photo-lithography process, so that a first gate electrode 8 is selectively formed on the gate oxide film 3 in the memory cell region 10, and a second gate electrode 11 is selectively formed on the gate oxide film 4 in the n-channel region 20N of the memory cell region 10, as well as a third gate electrode 12 is selectively formed on the gate oxide film 4 in the p-channel region 20P of the memory cell region 10. Each of the first, second and third gate electrodes 8, 11 and 12 comprises a polycide structure which comprises the laminations of the polysilicon film 6 and the tungsten silicide film 7.

Figure 2D:
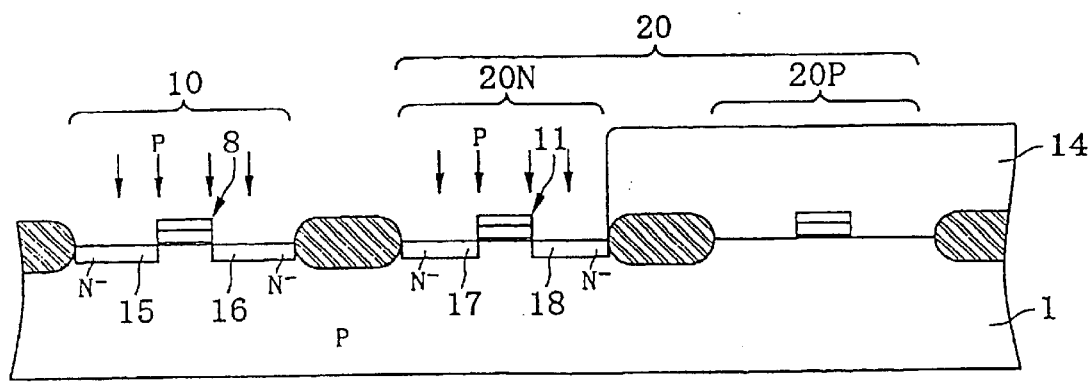

With reference to FIG. 2D, a first photo-resist film 14 is selectively formed which covers the p-channel region 20P of the logic region 20. An ion-implantation of an n-type impurity of phosphorous is carried out at a dose of 1E12–1E13 by use of the first photo-resist film 14 as a mask as well as use of the first and second gate electrodes 8 and 11 as masks in self-alignment technique, so that the n-type impurity of phosphorous is implanted into the memory cell region 10 and the n-channel region 20N of the logic region 20 except under the first and second gate electrodes 8 and 11. An anneal is then carried out to cause thermal diffusions of the implanted n-type impurity, whereby n-$^-$type source and drain regions 15 and 16 are selectively formed in the memory cell region 10, whilst n-$^-$type source and drain regions 17 and 18 are selectively formed in the n-channel region 20N of the logic region 20. The used first photo-resist film 14 is removed.

Figure 2E:
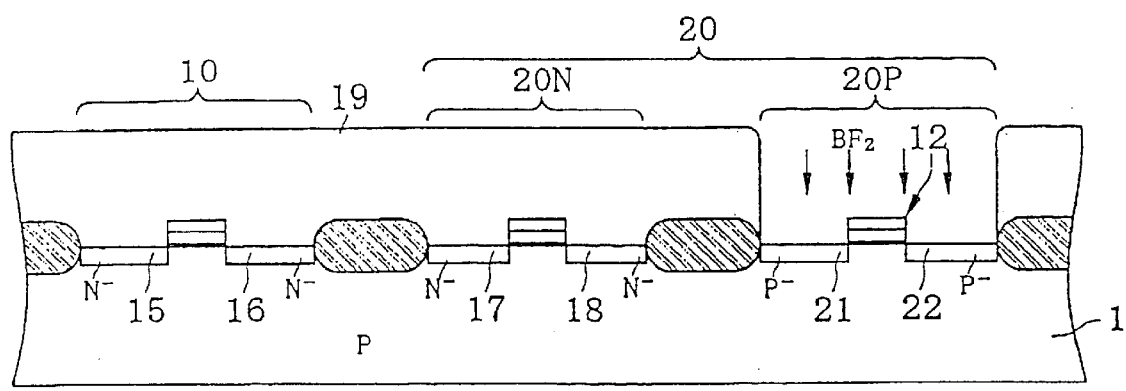

With reference to FIG. 2E, a second photo-resist film 19 is selectively formed which covers the memory cell region 10 and the n-channel region 20N of the logic region 20. An ion-implantation of a p-type impurity of boron fluoride ($BF_2$) is carried out at a dose of 1E13–1E14 by use of the second photo-resist film 19 as a mask as well as use of the third gate electrode 12 as a mask in self-alignment technique, so that the p-type impurity of boron fluoride ($BF_2$) is implanted into the p-channel region 20P of the logic region 20 except under the third gate electrode 12. An anneal is then carried out to cause thermal diffusions of the implanted p-type impurity, whereby p-$^-$type source and drain regions 21 and 22 are selectively formed in the p-channel region 20P of the logic region 20. The used second photo-resist film 19 is removed.

Figure 2F:
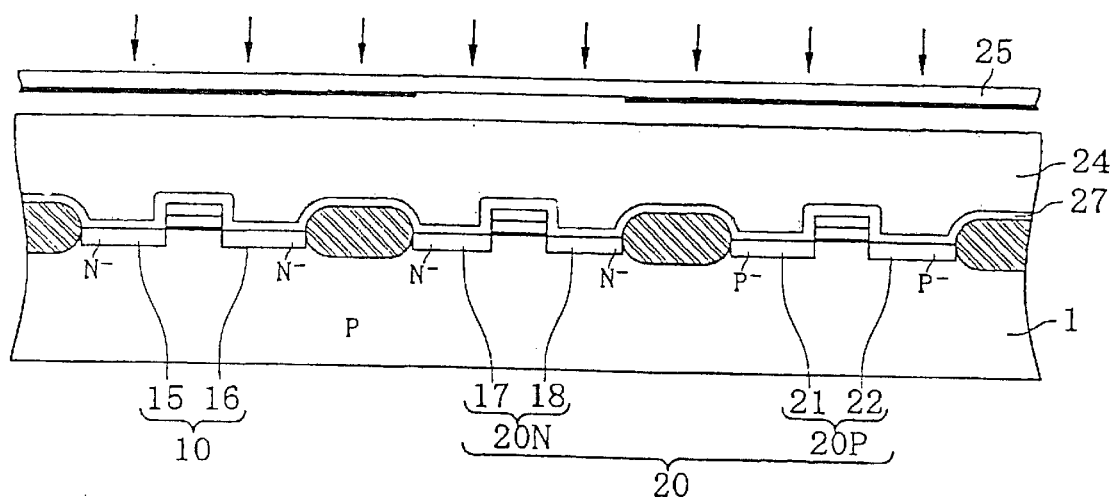

With reference to FIG. 2F, a silicon oxide film 27 is entirely formed over the field oxide films 2 and the memory cell region 10 as well as the logic region 20 by a chemical vapor deposition method, so that the silicon oxide film 27 extends over the field oxide films 2, the n-⁻type source and drain regions 15 and 16 of the memory cell region 10, the n-⁻type source and drain regions 17 and 18 of the n-channel region 20N of the logic region 20 and the p-⁻type source and drain regions 21 and 22 of the p-channel region 20P of the logic region 20. The silicon oxide film 27 has a thickness in the range of 90–110 nanometers. A second photo-resist film 24 is entirely applied on the silicon oxide film 27. A first photo-mask 25 is used to selectively expose the second photo-resist film 24 to an ultraviolet ray. The first photo-mask 25 has such a pattern that a part of the second photo-resist film 24 over the n-channel region 20N of the logic region 20 is exposed to the ultraviolet ray, This first photo-mask 25 is used for the purpose of forming n-type source and drain regions in the n-channel region 20N of the logic region 20. The first photo-mask 25 is one, usually used in the normal process for forming n-type source and drain regions in the n-channel region 20N of the logic region 20. It is unnecessary to use any additional photo-mask.

Figure 2G:
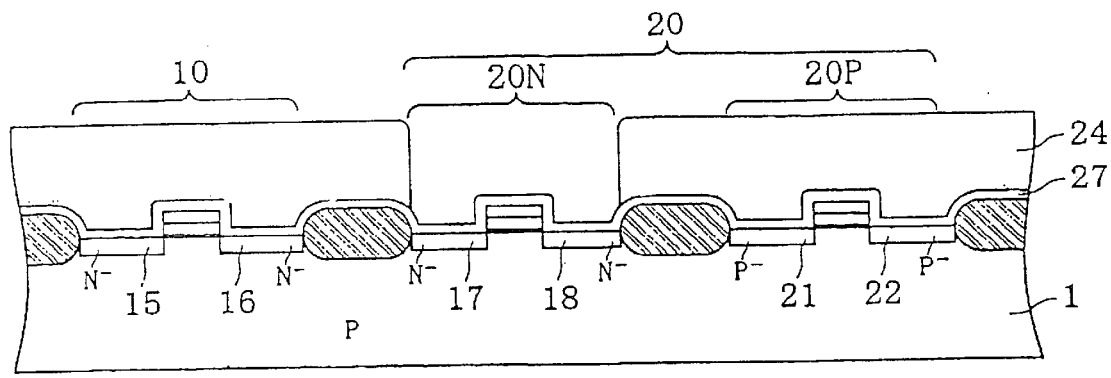

With reference to FIG. 2G, a development is carried out to selectively remove the exposed part of the second photo-resist film 24, whereby the silicon oxide film 27 in the n-channel region 20N of the logic region 20 is shown.

Figure 2H:
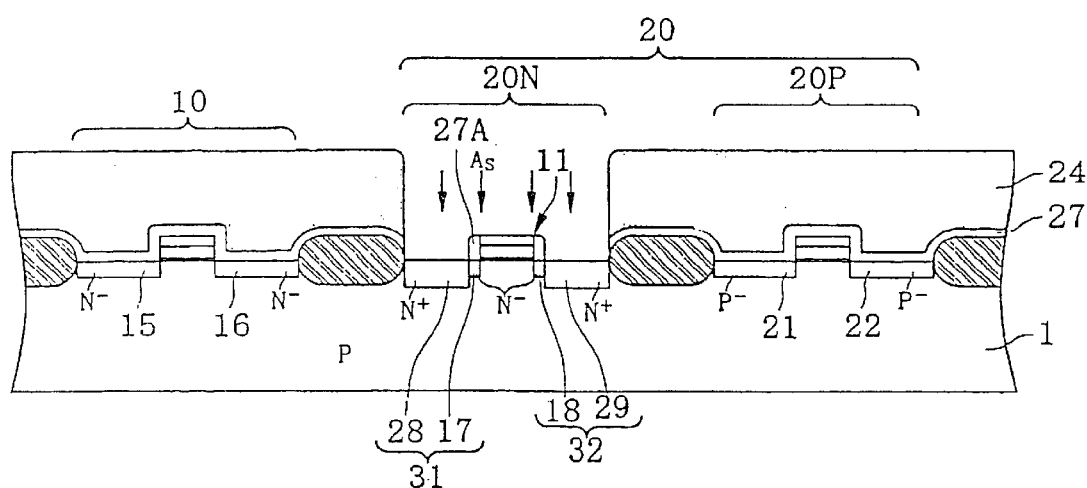

With reference to FIG. 2H, the silicon oxide film 27 in the n-channel region 20N of the logic region 20 is subjected to an etch back for 30–40 seconds by use of the second photo-resist film 24, whereby the silicon oxide film 27 remains on side walls of the second gate electrode 11. Namely, side wall oxide films 27A are formed on the side walls of the second gate electrode 11. The n-⁻type source and drain regions 17 and 18 of the n-channel region 20N of the logic region 20 are shown except under the side wall oxide films 27A An ion-implantation of an n-type impurity of arsenic is carried out by use of the second photo-resist film 24 as a mask and also use of the second gate electrode 11 and the side wall oxide films 27A as masks in self-alignment technique, so that the n-type impurity of arsenic is implanted into the n-channel region 20N of the logic region 20 at a dose of 1E14–1E15 atoms/cm². An anneal is then carried out to cause a thermal diffusion of the implanted n-type impurity, so that n-⁺type source and drain regions 28 and 29 are formed in the n-channel region 20N of the logic region 20 except under the second gate electrode 11 and the side wall oxide films 27A, whereby the n-⁻type source and drain regions 17 and 18 remain only under the side wall oxide films 27A. As a result, n-type source and drain regions 31 and 32 having the lightly doped drain structures are formed in the n-channel region 20N of the logic region 20. The used second photo-resist film 24 is then removed.

Figure 2I:
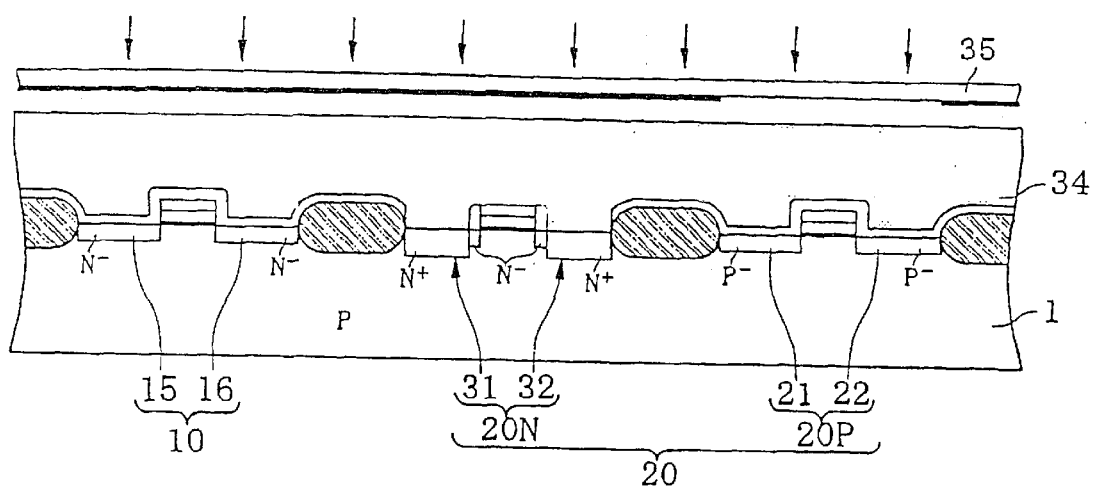

With reference to FIG. 2I, a third photo-resist film 34 is entirely applied over the memory cell region 10 and the n-channel and p-channel regions 20N and 20P of the logic region 20, so that the third photo-resist film 34 extends on the silicon oxide film 27 and on the n-type source and drain regions 31 and 32, the side wall oxide films 27A and the second gate electrode 11 in the n-channel region 20N of the logic region 20. A second photo-mask 35 is used to selectively expose the third photo-resist film 34 to an ultraviolet ray. The second photo-mask 35 has such a pattern that a part of the third photo-resist film 34 over the p-channel region 20P of the logic region 20 is exposed to the ultraviolet ray. This second photo-mask 35 is used for the purpose of forming p-type source and drain regions in the p-channel region 20P of the logic region 20. The second photo-mask 35 is one usually used in the normal process for forming p-type source and drain legions in the p-channel region 20P of the logic region 20. It is unnecessary to use any additional photo-mask.

Figure 2J:
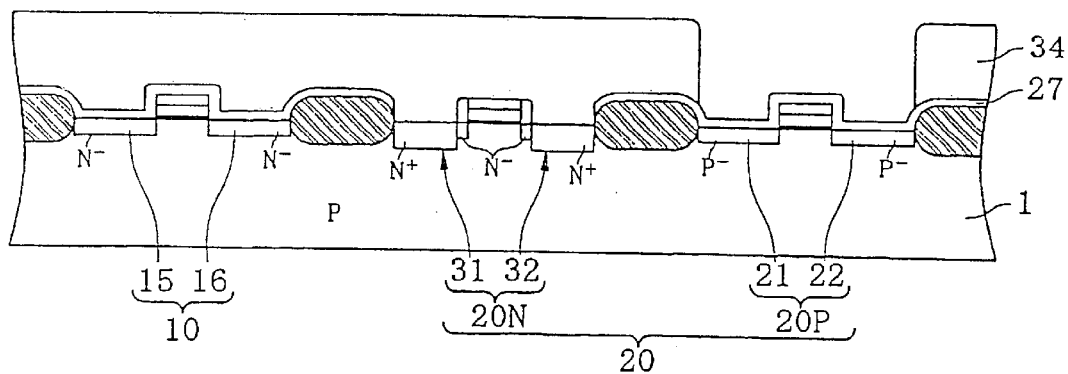

With reference to FIG. 2J, a development is carried out to selectively remove the exposed part of the third photo-resist film 34, whereby the silicon oxide film 27 in the p-channel region 20P of the logic region 20 is shown.

Figure 2K:
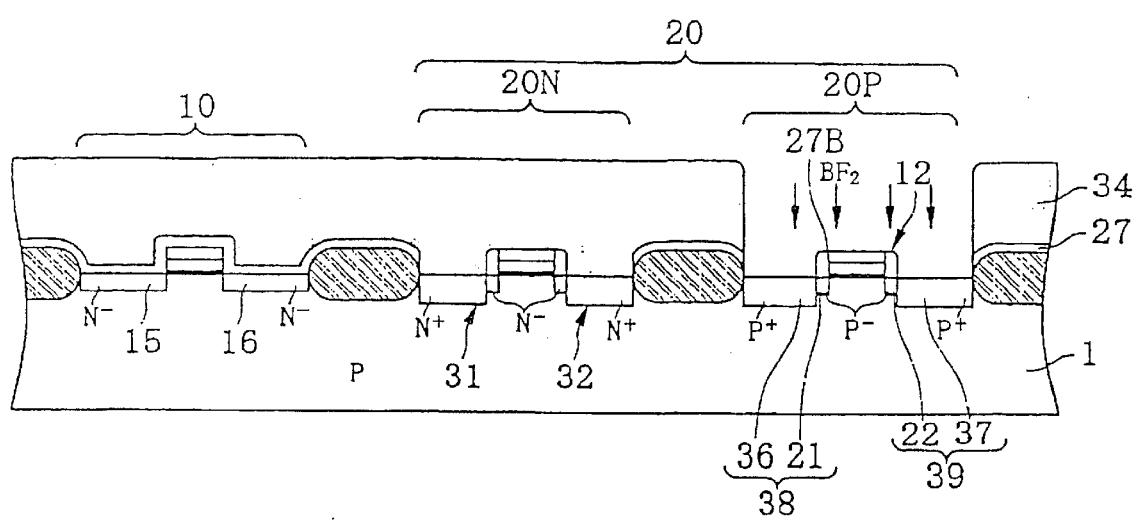

With reference to FIG. 2K, the silicon oxide film 27 in the p-channel region 20P of the logic region 20 is subjected to an etch back for 30–40 seconds by use of the third photo-resist film 34, whereby the silicon oxide film 27 remains on side walls of the third gate electrode 12. Namely, side wall oxide films 27B are formed on the side walls of the third gate electrode 12. The p-⁻type source and drain regions 21 and 22 of the p-channel region 20P of the logic region 20 are shown except under the side wall oxide films 27B. An ion-implantation of a p-type impurity of boron fluoride is carried out by use of the third photo-resist film 34 as a mask and also use of the third gate electrode 12 and the side wall oxide films 27B as masks in self-alignment technique, so that the p-type impurity of boron fluoride is implanted into the p-channel region 20P of the logic region 20 at a dose of 1E14–1E15 atoms/cm². An anneal is then carried out to cause a thermal diffusion of the implanted p-type impurity, so that p-⁺type source and drain regions 36 and 37 are formed in the pchannel region 20P of the logic region 20 except under the second gate electrode 11 and the side wall oxide films 27B, whereby the n-⁻type source and drain regions 21 and 22 remain only under the side wall oxide films 27B. As a result, p-type source and drain regions 38 and 39 having the lightly doped drain structures are formed in the p-channel region 20P of the logic region 20. The used third photo-resist film 34 is then removed. The silicon oxide film 27 remains over the field oxide films 2 as well as over the n-⁻type the memory cell region 10.

Figure 2L:
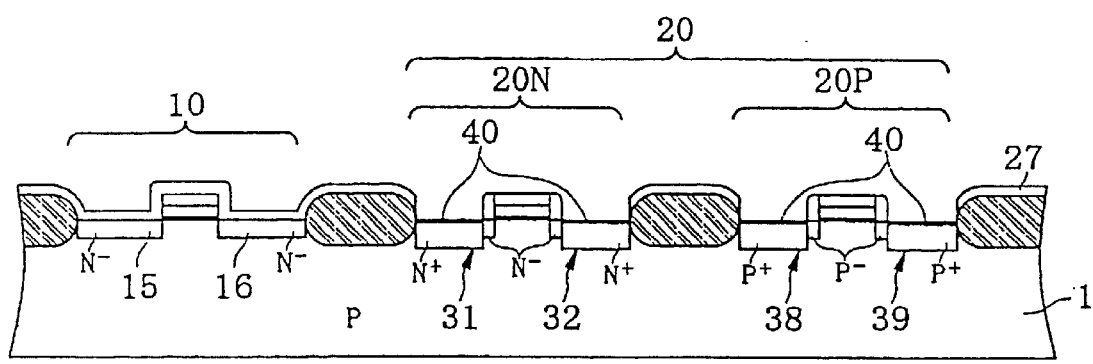

With reference to FIG. 2L, a titanium film is entirely deposited by a sputtering method over the memory cell region 10 and the n-channel and p-channel regions 20N and 20P of the logic region 20. As a result, the titanium film extends over the silicon oxide film 27 on the field oxide films 2 and the memory cell region 10, The titanium film also extends over the n-type source and drain regions 31 and 32 and side wall oxide films 27A as well as the second gate electrode 11 in the n-channel region 20N of the logic region 20. The titanium film also extends over the p-type source and drain regions 38 and 39 and side wall oxide films 27B as well as the third gate electrode 12 in the p-channel region 20P of the logic region 20. The titanium film has a thickness in the range of 10–15 micrometers. The substrate 1 is then subjected to a heat treatment in an inert gas atmosphere at a temperature in the range of 680–700° C. for 1–3 minutes, thereby to cause silicidation reaction of titanium in the titanium film with silicon both in the n-type source and drain regions 31 and 32 in the n-channel region 20N of the logic region 20 and also in the p-type source and drain regions 38 and 39 in the p-channel region 20P of the logic region 20. As a result, titanium silicide layers 40 are formed on the n-type source and drain regions 31 and 32 in the n-channel region 20N of the logic region 20 and also in the p-type source and drain regions 38 and 39 in the p-channel region 20P of the logic region 20. Unreacted titanium layers remain over the silicon oxide film 27 and the second and third gate electrodes 11 and 12. The unreacted titanium layers are then removed by an etching process.

As described above, the titanium silicide layers 40 are selectively formed without using any additional photo-mask to the first and second photo-masks 25 and 35 which have been used for the purpose of forming he n-type source and drain regions 31 and 32 in the n-channel region 20N of the logic region 20 and also forming the ptype source and drain regions 38 and 39 in the p-channel region 20P of the logic region 20. Namely, in this embodiment, the n-type source and drain regions 31 and 32 having the lightly-doped drain structures and the p-type source and drain regions 38 and 39 having the lightly-doped drain structures have been formed in the n-channel and p-channel regions 20N and 20P of the logic region 20, respectively, before the titanium film is deposited, wherein the n-type source and drain regions 31 and 32 and the p-type source and drain regions 38 and 39 are shown. It is, therefore, unnecessary to remove the gate oxide films from surfaces of the n-type source and drain regions 31 and 32 and the p-type source and drain regions 38 and 39 before the titanium film is deposited thereon. Accordingly, the silicide layers 40 are selectively formed only in the logic region 20 without, however, removing the gate oxide films by any additional photo-lithography using any photo-mask. No need to carry out any additional photo-lithography using any photo-mask allows a substantive reduction in the manufacturing cost of the semiconductor device.

Figure 2M:
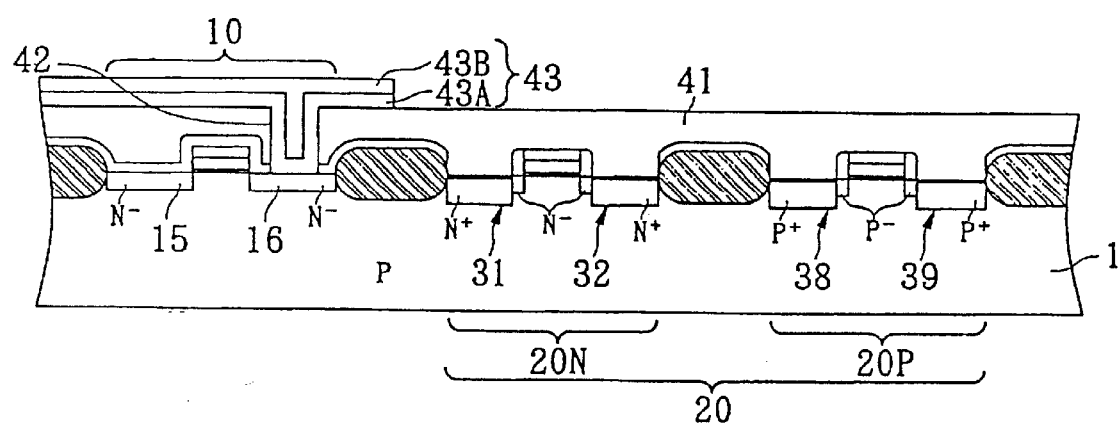

With reference to FIG. 2M, a first inter-layer insulator 41 of silicon oxide is entirely deposited by a chemical vapor deposition method over the memory cell region 10 and the n-channel and p-channel regions 20N and 20P of the logic region 20. As a result, the first inter-layer insulator 41 extends over the silicon oxide film 27 on the field oxide films 2 and the memory cell region 10. The first inter-layer insulator 41 also extends over the titanium silicide layers 40 and side wall oxide films 27A as well as over the second gate electrode 11 in the n-channel region 20N of the logic region 20. The first inter-layer insulator 41 also extends over the titanium silicide layers 40 and side wall oxide films 27B as well as over the third gate electrode 12 in the p-channel region 20P of the logic region 20. The first inter-layer insulator 41 has a thickness in the range of 0.7–0.8 micrometers. A first contact hole 42 is formed in the first inter-layer insulator 41 and the silicon oxide film 27 over the n-$^-$type drain region 16 in the memory cell region 10, so that the first contact hole 42 is positioned over the n-$^-$type drain region 16 in the memory cell region 10, whereby a part of the surface of the n-$^-$type drain region 16 is shown through the first contact hole 42. A bit line 43 is selectively formed within the first contact hole 42 and over the first inter-layer insulator 41 in the memory cell region 10. The bit line 43 comprises laminations of a polysilicon film 43A and a tungsten silicide layer 43B.

Figure 2N:
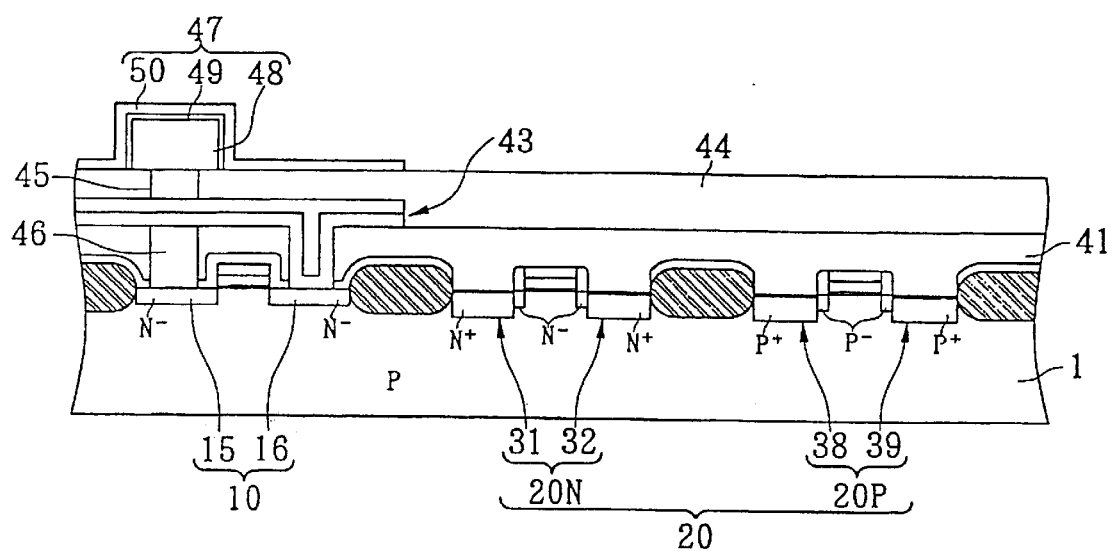
Figure 2O:
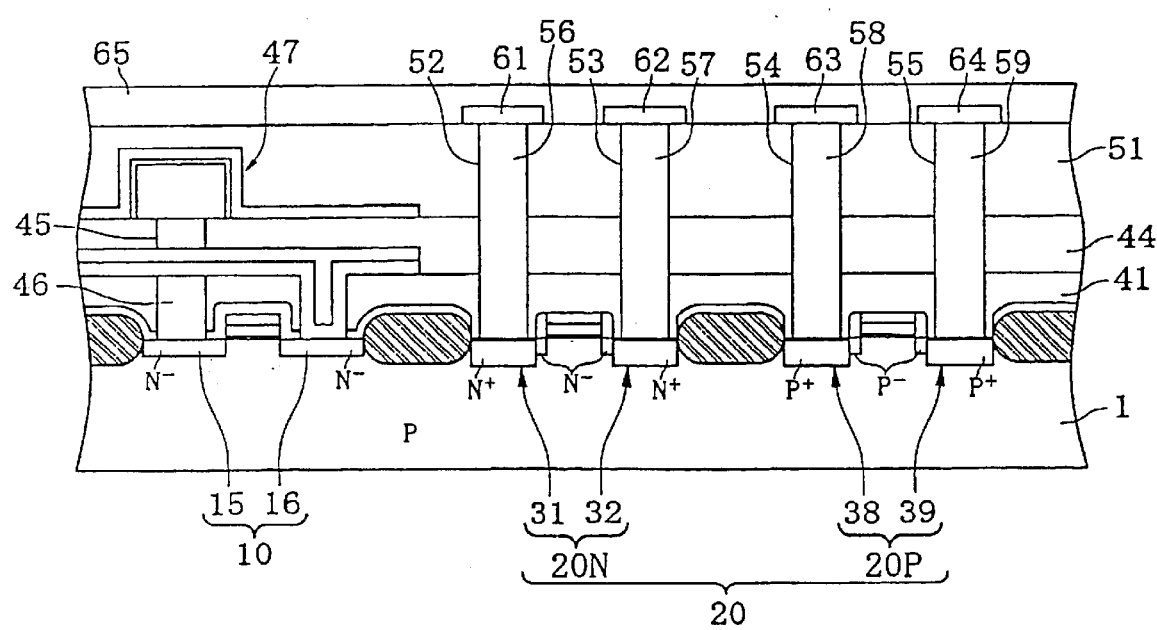

With reference to FIG. 2N, a second inter-layer insulator 44 is entirely formed by a chemical vapor deposition method over the bit line 43 and the first inter-layer insulator 41, so that the second inter-layer insulator 44 extends over the memory cell region 10 and the logic region 20. The second inter-layer insulator 44 has a thickness in the range of 0.5–0.6 micrometers. A second contact hole 45 is formed in the first and second inter-layer insulators 41 and 44 and in the silicon oxide film 27 over the n-type source region 15 in the memory cell region 10, so that the second contact hole 45 is positioned over the n-$^-$type source region 15 in the memory cell region 10, whereby a part of the surface of the n-$^-$type source region 15 is shown through the second contact hole 45. A first plug conductor 46 is formed within the second contact hole 45, so that the first plug conductor 46 is in contact with the part of the surface of the n-$^-$type source region 15. The first plug conductor 46 may be made of polysilicon. A capacitor 47 is formed on the second inter-layer insulator 44 in the memory cell region 10, so that the capacitor 47 is positioned over the first plug conductor 46. The capacitor 47 comprises a storage electrode 48, a capacitive dielectric film 49 and an opposite electrode 50.

The storage electrode 48 is in contact with the first plug conductor 46, so that the storage electrode 48 is electrically connected through the first plug conductor 46 to the n-type source region 15. The storage electrode 48 may be made of polysilicon. The capacitive dielectric film 49 may comprise a silicon nitride film. The opposite electrode 50 may comprise a polysilicon film.

With reference to FIG. 20, a third inter-layer insulator 51 is entirely formed by a chemical vapor deposition method over the capacitor 47 and the second inter-layer insulator 44, so that the third inter-layer insulator 51 extends over the memory cell region 10 and the logic region 20. The third inter-layer insulator 51 has a thickness in the range of 1.1–1.3 micrometers. A third contact hole 52 is formed in the first, second and third inter-layer insulators 41, 44 and 51 and in the silicon oxide film 27 over the n-+type source region 31 in the n-channel region 20N of the logic region 20, so that the third contact hole 52 is positioned over the n-$^+$type source region 31 in the n-channel region 20N of the logic region 20, whereby a part of the surface of the n-+type source region 31 is shown through the third contact hole 52. A fourth contact hole 53 is formed in the first, second and third inter-layer insulators 41, 44 and 51 and in the silicon oxide film 27 over the n-$^+$type drain region 32 in the n-channel region 20N of the logic region 20, so that the fourth contact hole 53 is positioned over the n-$^+$type drain region 32 in the n-channel region 20N of the logic region 20, whereby a part of the surface of the n+type drain region 32 is shown through the fourth contact hole 53. A fifth contact hole 54 is formed in the first, second and third inter-layer insulators 41, 44 and 51 and in the silicon oxide film 27 over the p-$^+$type source region 38 in the p-channel region 20P of the logic region 20, so that the fifth contact hole 54 is positioned over the p-$^+$type source region 38 in the p-channel region 20P of the logic region 20, whereby a part of the surface of the p-$^+$type source region 38 is shown through the fifth contact hole 54. A sixth contact hole 55 is formed in the first, second and third inter-layer insulators 41, 44 and 51 and in the silicon oxide film 27 over the p-$^+$type drain region 39 in the p-channel region 20P of the logic region 20, so that the sixth contact hole 55 is positioned over the p-$^+$type drain region 39 in the p-channel region 20P of the logic region 20, whereby a part of the surface of the p-$^+$type drain region 39 is shown through the sixth contact hole 55. A second plug conductor 56 is formed within the third contact hole 52, so that the second plug conductor 56 is in contact with the part of the surface of the n-$^+$type source region 31. The second plug conductor 56 may comprise laminations of titanium/titanium nitride barrier metal films and a tungsten film. A third plug conductor 57 is formed within the fourth contact hole 53, so that the third plug conductor 57 is in contact with the part of the surface of the n-$^+$type drain region 32. The third plug conductor 57 may comprise laminations of titanium/titanium nitride barrier metal films and a tungsten film. A fourth plug conductor 58 is formed within the fifth contact hole 54, so that the fourth plug conductor 58 is in contact with the part of the surface of the p-$^+$type source region 38. The fourth plug conductor 58 may comprise laminations of titanium/titanium nitride barrier metal films and a tungsten film. A fifth plug conductor 59 is formed within the sixth contact hole 55, so that the fifth plug conductor 59 is in contact with the part of the surface of the p-$^+$type drain region 39. The fifth plug conductor 59 may comprise laminations of titanium/ titanium nitride barrier metal films and a tungsten film. A first interconnection 61 is formed over the third inter-layer insulator 51, so that the first interconnection 61 is in contact with the second plug conductor 56 within the third contact hole 52, whereby the first interconnection 61 is electrically connected through the second plug conductor 56 to the n-+type source region 31 in the n-channel region 20N of the logic region 20. A second interconnection 62 is formed over the third inter-layer insulator 51, so that the second interconnection 62 is in contact with the third plug conductor 57 within the fourth contact hole 53, whereby the second interconnection 62 is electrically connected through the third plug conductor 57 to the n-+type drain region 32 in the n-channel region 20N of the logic region 20. A third interconnection 63 is formed over the third inter-layer insulator 51, so that the third interconnection 63 is in contact with the fourth plug conductor 58 within the fifth contact hole 54, whereby the third interconnection 63 is electrically connected through the fourth plug conductor 58 to the p-+type source region 38 in the p-channel region 20P of the logic region 20. A fourth interconnection 64 is formed over the third inter-layer insulator 51, so that the fourth interconnection 64 is in contact with the fifth plug conductor 59 within the sixth contact hole 55, whereby the fourth interconnection 64 is electrically connected through the fifth plug conductor 59 to the p-+type drain region 39 in the p-channel region 20P of the logic region 20. The above first to fourth interconnections 61, 62, 63 and 64 may be made of aluminum. A passivation film 65 is finally formed on the third inter-layer insulator 51 and on the first to fourth interconnections 61, 62, 63 and 64, whereby a semiconductor device is completed which has an integration of the memory cell region 10 and the logic region 20, wherein the tungsten silicide layers 40 are selectively formed only in the logic region 20.

As described above, the titanium silicide layers 40 are selectively formed without using any additional photo-mask to the first and second photo-masks 25 and 35 which have been used for the purpose of forming the n-type source and drain regions 31 and 32 in the n-channel region 20N of the logic region 20 and also forming the p-type source and drain regions 38 and 39 in the p-channel region 20P of the logic region 20. Namely, in this embodiment, the n-type source and drain regions 31 and 32 having the lightly-doped drain structures and the p-type source and drain regions 38 and 39 having the lightly-doped drain structures have been formed in the n-channel and p-channel regions 20N and 20P of the logic region 20, respectively, before the titanium film is deposited, wherein the n-type source and drain regions 31 and 32 and the p-type source and drain regions 38 and 39 are shown. It is, therefore, unnecessary to remove the gate oxide films from surfaces of the n-type source and drain regions 31 and 32 and the p-type source and drain regions 38 and 39 before the titanium film is deposited thereon. Accordingly, the silicide layers 40 are selectively formed only in the logic region 20 without, however, removing the gate oxide films by any additional photo-lithography using any photo-mask. No need to carry out any additional photo-lithography using any photo-mask allows a substantive reduction in the manufacturing cost of the semiconductor device.

It is possible to modify the above embodiment as follows. In place of titanium, other refractory metals such as cobalt, molybdenum, tantalum, chromium and tungsten may be available for selectively forming the silicide layer only on the logic region.

In place of the polycide structure of the gate electrode, a polysilicon gate electrode may be available.

It is also possible that the source and drain regions have a salicide structure.

It is also possible that the MOS field effect transistor in the memory cell region also has a lightly-doped drain stricture.

It is also possible that the capacitor is formed under the bit line in the memory cell region.

It is also possible that the single MOS field effect transistor is formed in the logic region in place of the CMOS transistors.

It is also possible to use an electron beam lithography or an X-ray lithography in place of the photo-lithography.

It is possible to use a silicon nitride film or laminations of a silicon oxide film and a silicon nitride film for the gate insulation film.

It is possible to form a metal insulator semiconductor (MIS transistor). Namely, not only the MOS field effect transistor but also a metal nitride semiconductor field effect transistor (MNOS transistor) or a metal nitride oxide semiconductor field effect transistor (MNOS transistor) may be formed by use of the above novel method.

It is, of course, possible to change the conductivity types of the substrate and all of the semiconductor regions.

It is also possible to change the substances, thickness, concentration and method of deposition of the films for the insulation films and the conductive films and the semiconductor regions.

Second Embodiment

Figure 3A:
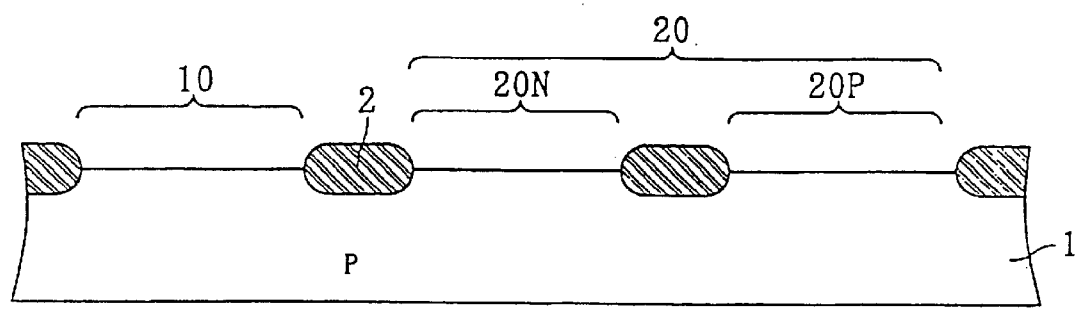
FIGS. 3A through 3P are fragmentary cross sectional elevation views illustrative of semiconductor substrates in sequential steps involved in a novel method of selectively forming silicide layers on a logic area of a DRAM which has an integration of the logic area and a memory cell area in a second embodiment in accordance with the present invention.

A second embodiment according to the present invention will be described in detail with reference to the drawings. FIGS. 3A through 3P are fragmentary cross sectional elevation views illustrative of semiconductor substrates in sequential steps involved in a novel method of selectively forming silicide layers on a logic area of a DRAM which has an integration of the logic area and a memory cell area in a second embodiment in accordance with the present invention.

With reference to FIG. 3A, field oxide films 2 are selectively formed on a surface of a p-type silicon substrate 1 by a local oxidation of silicon method or a shallow trench isolation method, so that the field oxide films 2 define a memory cell region 10 as an active region as well as n-channel and p-channel regions 20N and 20P of a logic region 20. In this embodiment, CMOS transistors are intended to be formed in the logic region 20. Namely, the logic region 20 comprises the n-channel and p-channel regions 20N and 20P.

Figure 3B:
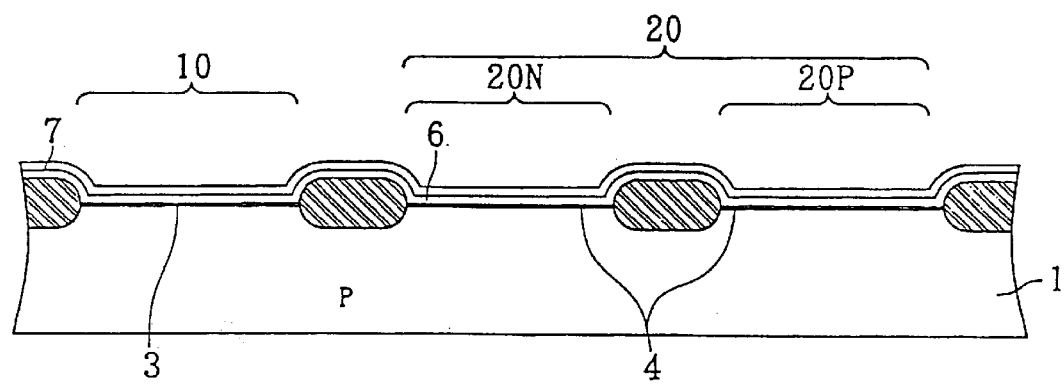

With reference to FIG. 3B, gate oxide films 3 and 4 are formed on the memory cell region 10 and the logic region 20 by a thermal oxidation method, wherein the thermal oxidation method comprises two steps so that the gate oxide films 3 and 4 are different in thickness from each other in order to adjust required different characteristics. The gate oxide film 3 formed on the memory cell region 10 has a thickness in the range of 7–10 nanometers. The gate oxide film 4 formed on the logic region 20 has a thickness in the range of 4–5 nanometers. Subsequently, a polysilicon film 6 is entirely formed by a chemical vapor deposition method, so that the polysilicon film 6 extends over the field oxide films 2 and the gate oxide films 3 and 4. The polysilicon film 6 has a thickness in the range of 90–110 nanometers. A tungsten silicide film 7 is entirely formed by a chemical vapor deposition method, so that the tungsten silicide film 7 extends over the polysilicon film 6. The tungsten silicide film 7 has a thickness in the range of 100–150 nanometers.

Figure 3C:
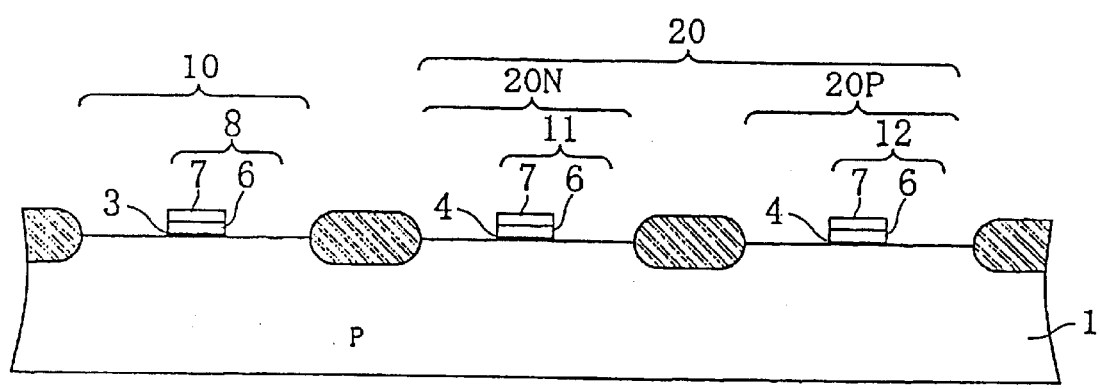

With reference to FIG. 3C, laminations of the polysilicon film 6 and the tungsten silicide film 7 are patterned by a photo-lithography process, so that a first gate electrode 8 is selectively formed on the gate oxide film 3 in the memory cell region 10, and a second gate electrode 11 is selectively formed on the gate oxide film 4 in the n-channel region 20N of the memory cell region 10, as well as a third gate electrode 12 is selectively formed on the gate oxide film 4 in the p-channel region 20P of the memory cell region 10. Each of the first, second and third gate electrodes 8, 11 and 12 comprises a polycide structure which comprises the laminations of the polysilicon film 6 and the tungsten silicide film 7.

Figure 3D:
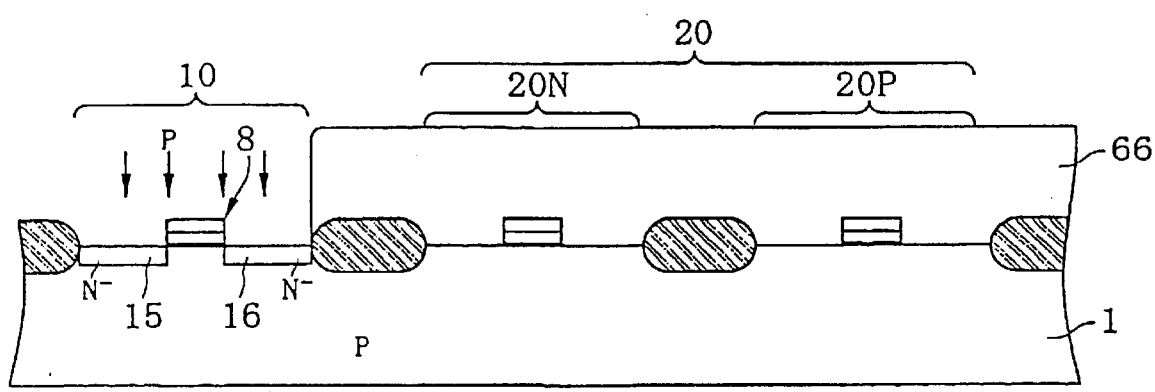

With reference to FIG. 3D, a first photo-resist film 66 is selectively formed which covers the n-channel and p-channel regions 20N and 20P of the logic region 20. An ion-implantation of an n-type impurity of phosphorous is carried out at a dose of 1E12–1E13 by use of the first photo-resist film 66 as a mask as well as use of the first gate electrode 8 as a mask in self-alignment technique, so that the n-type impurity of phosphorous is implanted into the memory cell region 10 except under the first gate electrode 8. An anneal is then carried out to cause thermal diffusions of the implanted n-type impurity, whereby n-type source and drain regions 15 and 16 are selectively formed in the memory cell region 10. The used first photo-resist film 66 is removed.

Figure 3E:
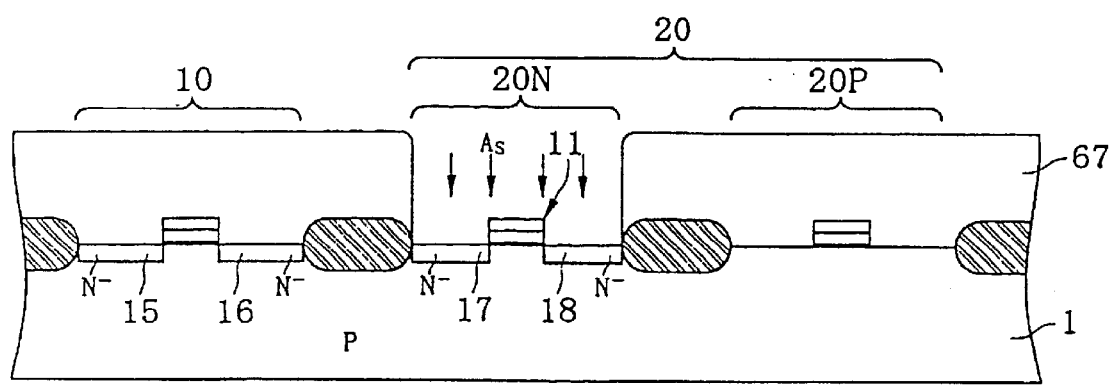

With reference to FIG. 3E, a second photo-resist film 67 is selectively formed which covers the memory cell region 10 and the p-channel region 20P of the logic region 20. An ion-implantation of an n-type impurity of arsenic is carried out at a dose of 1E13–1E14 by use of the second photo-resist film 67 as a mask as well as use of the second gate electrode 11 as a mask in self-alignment technique, so that the n-type impurity of arsenic is implanted into the n-channel region 2ON of the logic region 20 except under the second gate electrode 11. An anneal is then carried out to cause thermal diffusions of the implanted n-type impurity, whereby n-$^-$type source and drain regions 17 and 18 are selectively formed in the n-channel region 20N of the logic region 20. The used second photoresist film 67 is removed.

Figure 3F:
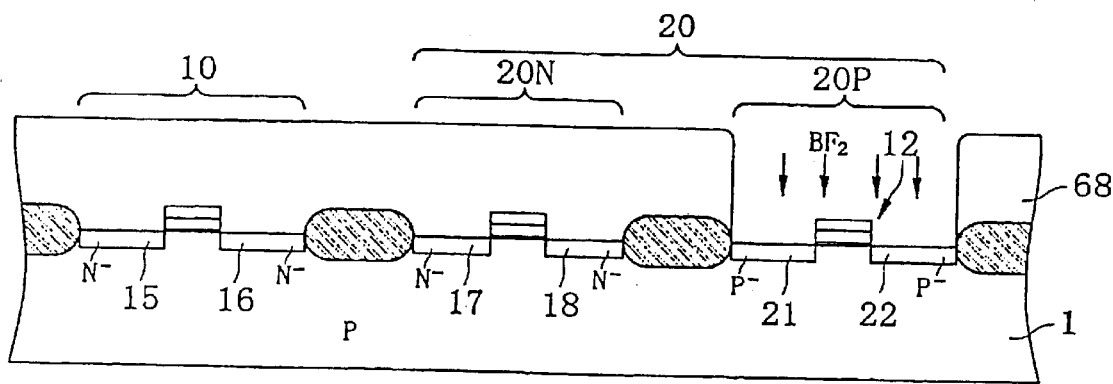

With reference to FIG. 3F, a third photo-resist film 68 is selectively formed which covers the memory cell region 10 and the n-channel region 20N of the logic region 20. An ion-implantation of a p-type impurity of boron fluoride ($BF_2$) is carried out at a dose of 1E13–1E14 by use of the third photo-resist film 68 as a mask as well as use of the third gate electrode 12 as a mask in self-alignment technique, so that the p-type impurity of boron fluoride ($BF_2$) is implanted into the p-channel region 20P of the logic region 20 except under the third gate electrode 12. An anneal is then carried out to cause thermal diffusions of the implanted p-type impurity, whereby p-$^-$type source and drain regions 21 and 22 are selectively formed in the p-channel region 20P of the logic region 20. The used third photo-resist film 68 is removed.

In this embodiment, formations of the source and drain regions 15 and 16 in the memory cell region 10 are carried out independently. The formations of the n-channel and p-channel regions 20N and 20P are independently formed. It is easy to optimize the memory cell region 10 and the n-channel and p-channel regions 20N and 20P of the logic region. Namely, the above processes make increased a freedom of design of the semiconductor device.

Figure 3G:
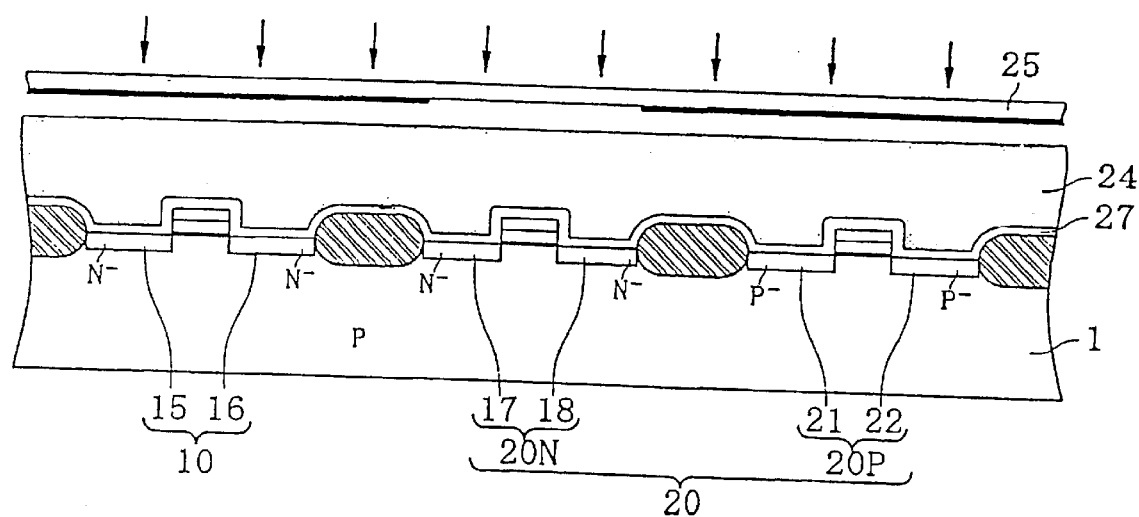

With reference to FIG. 3G, a silicon oxide film 27 is entirely formed over the field oxide films 2 and the memory cell region 10 as well as the logic region 20 by a chemical vapor deposition method, so that the silicon oxide film 27 extends over the field oxide films 2, the n-$^-$type source and drain regions 15 and 16 of the memory cell region 10, the n-$^-$type source and drain regions 17 and 18 of the n-channel region 20N of the logic region 20 and the p-$^-$type source and drain regions 21 and 22 of the p-channel region 20P of the logic region 20. The silicon oxide film 27 has a thickness in the range of 90–110 nanometers. A second photo-resist film 24 is entirely applied on the silicon oxide film 27. A first photo-mask 25 is used to selectively expose the second photo-resist film 24 to an ultraviolet ray. The first photo-mask 25 has such a pattern that a part of the second photo-resist film 24 over the n-channel region 20N of the logic region 20 is exposed to the ultraviolet ray. This first photo-mask 25 is used for the purpose of forming n-type source and drain regions in the n-channel region 20N of the logic region 20. The first photo-mask 25 is one usually used in the normal process for forming n-type source and drain regions in the n-channel region 20N of the logic region 20. It is unnecessary to use any additional photo-mask.

Figure 3H:
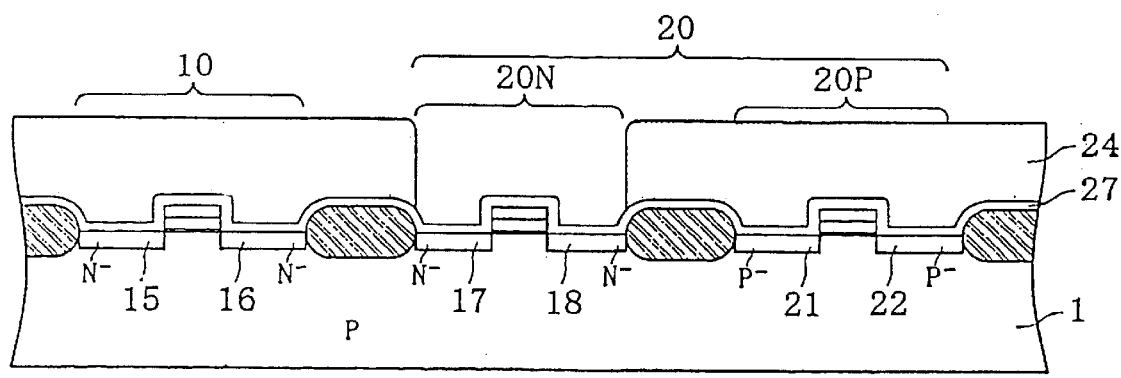

With reference to FIG. 3H, a development is carried out to selectively remove the exposed part of the second photo-resist film 24, whereby the silicon oxide film 27 in the n-channel region 20N of the logic region 20 is shown.

Figure 3I:
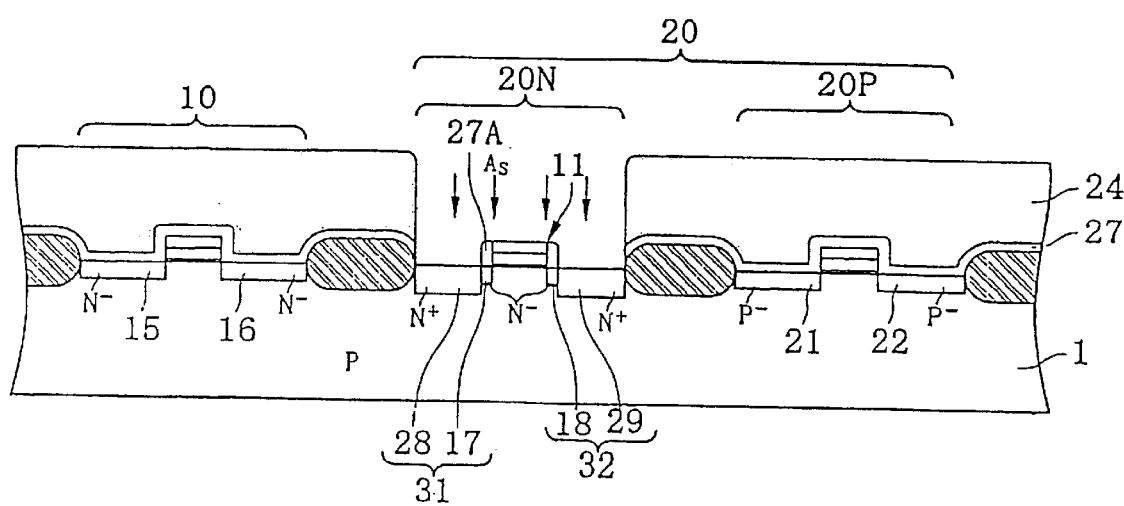

With reference to FIG. 3I, the silicon oxide film 27 in the n-channel region 20N of the logic region 20 is subjected to an etch back for 30–40 seconds by use of the second photo-resist film 24, whereby the silicon oxide film 27 remains on side walls of the second gate electrode 11. Namely, side wall oxide films 27A are formed on the side walls of the second gate electrode 11. The n-type source and drain regions 17 and 18 of the n-channel region 20N of the logic region 20 are shown except under the aside wall oxide films 27A. An ion-implantation of an n-type impurity of arsenic is carried out by use of the second photo-resist film 24 as a mask and also use of the second gate electrode 11 and the side wall oxide films 27A as masks in self-alignment technique, so that the n-type impurity of arsenic is implanted into the n-channel region 20N of the logic region 20 at a dose of 1E14–1E15 atoms/cm$^2$. An anneal is then carried out to cause a thermal diffusion of the implanted n-type impurity, so that n-+type source and drain regions 28 and 29 are formed in the n-channel region 20N of the logic region 20 except under the second gate electrode 11 and the side wall oxide films 27A, whereby the n-$^-$type source and drain regions 17 and 18 remain only under the side wall oxide films 27A. As a result, n-type source and drain regions 31 and 32 having the lightly doped drain structures are formed in the n-channel region 20N of the logic region 20. The used second photo-resist film 24 is then removed.

Figure 3J:
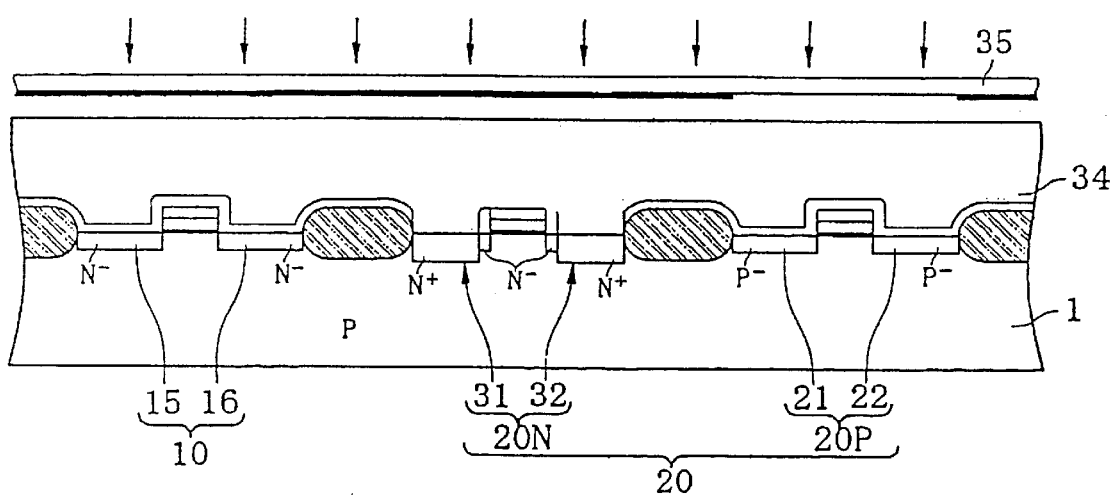

With reference to FIG. 3J, a third photo-resist film 34 is entirely applied over the memory cell region 10 and the n-channel and p-channel regions 20N and 20P of the logic region 20, so that the third photo-resist film 34 extends on the silicon oxide film 27 and on the n-type source and drain regions 31 and 32, the side wall oxide films 27A and the second gate electrode 11 in the n-channel region 20N of the logic region 20. A second photo-mask 35 is used to selectively expose the third photo-resist film 34 to an ultraviolet ray. The second photo-mask 35 has such a pattern that a part of the third photo-resist film 34 over the pchannel region 20P of the logic region 20 is exposed to the ultraviolet ray. This second photo-mask 35 is used for the purpose of forming p-type source and drain regions in the p-channel region 20P of the logic region 20. The second photo-mask 35 is one usually used in the normal process for forming p-type source and drain regions in the p-channel region 20P of the logic region 20. It is unnecessary to use any additional photo-mask.

Figure 3K:
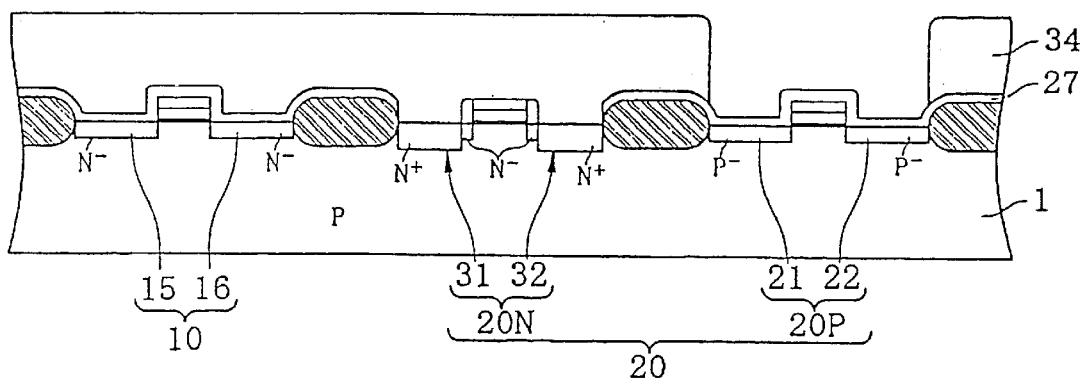

With reference to FIG. 3K, a development is carried out to selectively remove the exposed part of the third photo-resist film 34, whereby the silicon oxide film 27 in the p-channel region. 20P of the logic region 20 is shown.

Figure 3L:
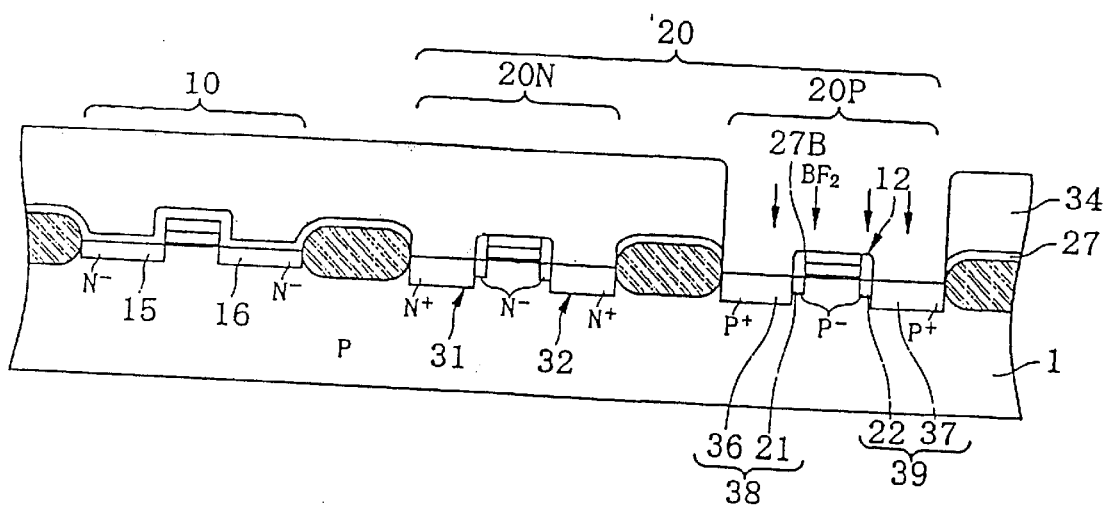

With reference to FIG. 3L, the silicon oxide film 27 in the p-channel region 20P of the logic region 20 is subjected to an etch back for 30–40 seconds by use of the third photo-resist film 34, whereby the silicon oxide film 27 remains on side walls of the third gate electrode 12. Namely, side wall oxide films 27B are formed on the side walls of the third gate electrode 12. The p-⁻type source and drain regions 21 and 22 of the p-channel region 20P of the logic region 20 are shown except under the side wall oxide films 27B. An ion-implantation of a p-type impurity of boron fluoride is carried out by use of the third photo-resist film 34 as a mask and also use of the third gate electrode 12 and the side wall oxide films 27B as masks in self-alignment technique, so that the p-type impurity of boron fluoride is implanted into the p-channel region 20P of the logic region 20 at a dose of 1E14–1E15 atoms/cm². An anneal is then carried out to cause a thermal diffusion of the implanted p-type impurity, so that p-⁺type source and drain regions 36 and 37 arc formed in the p-channel region 20P of the logic region 20 except under the second gate electrode 11 and the side wall oxide films 27B, whereby the n-⁻type source and drain regions 21 and 22 remain only under the side wall oxide films 27B. As a result, p-type source and drain regions 38 and 39 having the lightly doped drain structures are formed in the p-channel region 20P of the logic region 20. The used third photoresist film 34 is then removed. The silicon oxide film 27 remains over the field oxide films 2 as well as over the n-type the memory cell region 10.

Figure 3M:
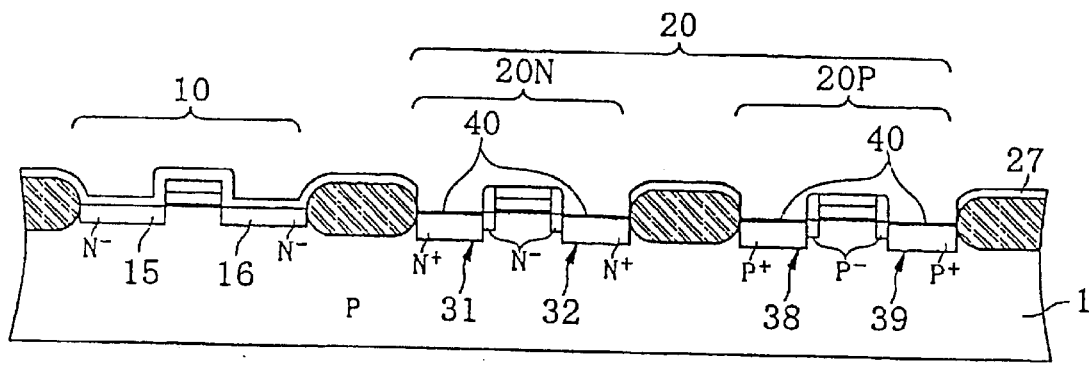

With reference to FIG. 3M, a titanium film is entirely deposited by a sputtering method over the memory cell region 10 and the n-channel and p-channel regions 20N and 20P of the logic region 20. As a result, the titanium film extends over the silicon oxide film 27 on the field oxide films 2 and the memory cell region 10. The titanium film also extends over the n-type source and drain regions 31 and 32 and side wall oxide films 27A as well as the second gate electrode 11 in the n-channel region 20N of the logic region 20. The titanium film also extends over the p-type source and drain regions 38 and 39 and side wall oxide films 27B as well as the third gate electrode 12 in the p-channel region 20P of the logic region 20. The titanium film has a thickness in the range of 10–15 micrometers. The substrate 1 is then subjected to a heat treatment in an inert gas atmosphere at a temperature in the range of 680–700° C. for 1–3 minutes, thereby to cause silicidation reaction of titanium in the titanium film with silicon both in the n-type source and drain regions 31 and 32 in the n-channel region 20N of the logic region 20 and also in the p-type source and drain regions 38 and 39 in the p-channel region 20P of the logic region 20. As a result, titanium silicide layers 40 are formed on the n-type source and drain regions 31 and 32 in the n-channel region 20N of the logic region 20 and also in the p-type source and drain regions 38 and 39 in the p-channel region 20P of the logic region 20. Unreacted titanium layers remain over the silicon oxide film 27 and the second and third gate electrodes 11 and 12. The unreacted titanium layers are then removed by an etching process.

As described above, the titanium silicide layers 40 are selectively formed without using any additional photo-mask to the first and second photo-masks 25 and 35 which have been used for the purpose of forming the n-type source and drain regions 31 and 32 in the n-channel region 20N of the logic region 20 and also forming the p-type source and drain regions 38 and 39 in the p-channel region 20P of the logic region 20. Namely, in this embodiment, the n-type source and drain regions 31 and 32 having the lightly-doped drain structures and the p-type source and drain regions 38 and 39 having the lightly-doped drain structures have been formed in the n-channel and p-channel regions 20N and 20P of the logic region 20, respectively, before the titanium film is deposited, wherein the n-type source and drain regions 31 and 32 and the p-type source and drain regions 38 and 39 are shown. It is, therefore, unnecessary to remove the gate oxide films from surfaces of the n-type source and drain regions 31 and 32 and the p-type source and drain regions 38 and 39 before the titanium film is deposited thereon. Accordingly, the silicide layers 40 are selectively formed only in the logic region 20 without, however, removing the gate oxide films by any additional photo-lithography using any photo-mask. No need to carry out any additional photo-lithography using any photo-mask allows a substantive reduction in the manufacturing cost of the semiconductor device.

Figure 3N:
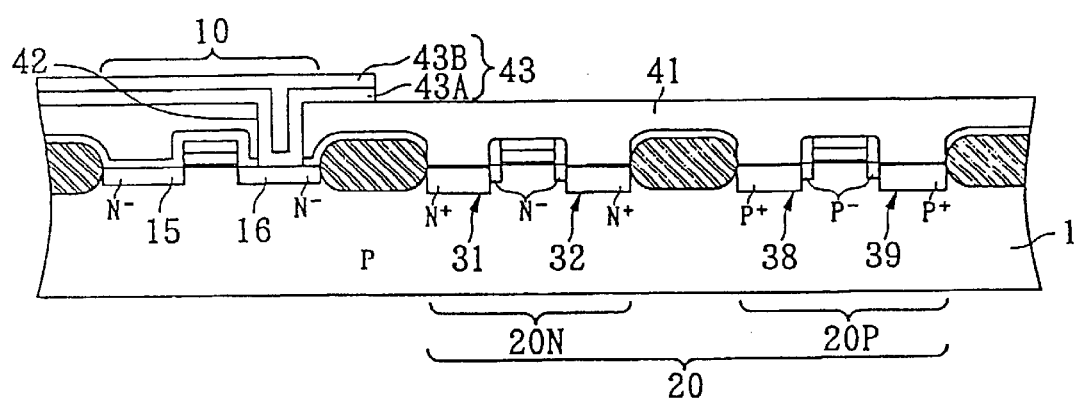

With reference to FIG. 3N, a first inter-layer insulator 41 of silicon oxide is entirely deposited by a chemical vapor deposition method over the memory cell region 10 and the a-channel and p-channel regions 20N and 20P of the logic region 20. As a result, the first inter-layer insulator 41 extends over the silicon oxide film 27 on the field oxide films 2 and the memory cell region. 10. The first inter-layer insulator 41 also extends over the titanium silicide layers 40 and side wall oxide films 27A as well as over the second gate electrode 11 in the n-channel region 20N of the logic region 20. The first inter-layer insulator 41 also extends over the titanium silicide layers 40 and side wall oxide films 27B as well as over the third gate electrode 12 in the p-channel region 20F of the logic region 20. The first inter-layer insulator 41 has a thickness in the range of 0.7–0.8 micrometers. A first contact hole 42 is formed in the first inter-layer insulator 41 and the silicon oxide film 27 over the n-type drain region 16 in the memory cell region 10, so that the first contact hole 42 is positioned over the n-type drain region 16 in the memory cell region 10, whereby a part of the surface of the n-type drain region 16 is shown through the first contact hole 42. A bit line 43 is selectively formed within the first contact hole 42 and over the first inter-layer insulator 41 in the memory cell region 10. The bit line 43 comprises laminations of a polysilicon film 43A and a tungsten silicide layer 43B.

Figure 3O:
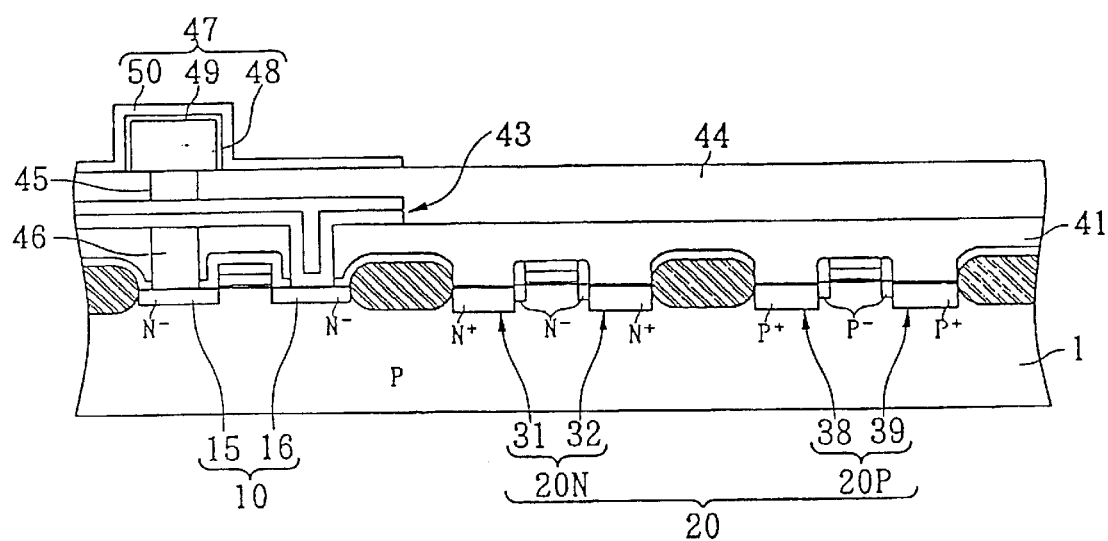
Figure 3P:
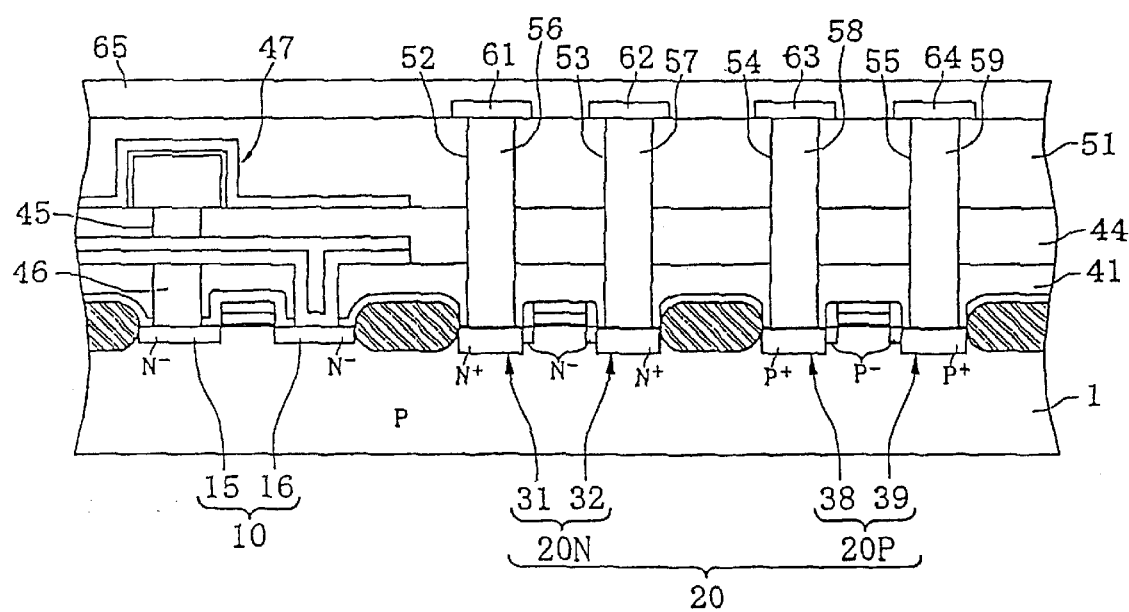

With reference to FIG. 3O, a second inter-layer insulator 44 is entirely formed by a chemical vapor deposition method over the bit line 43 and the first inter-layer insulator 41, so that the second inter-layer insulator 44 extends over the memory cell region 10 and the logic region 20. The second inter-layer insulator 44 has a thickness in the range of 0.5–0.6 micrometers. A second contact hole 45 is formed in the first and second inter-layer insulators 41 and 44 and in the silicon oxide film 27 over the n-type source region 15 in the memory cell region 10, so that the second contact hole 45 is positioned over the n-⁻type source region 15 in the memory cell region 10, whereby a part of the surface of the n-⁻type source region 15 is shown through the second contact hole 45. A first plug conductor 46 is formed within the second contact hole 45, so that the first plug conductor 46 is in contact with the part of the surface of the n-type source region 15. The first plug conductor 46 may be made of polysilicon. A capacitor 47 is formed on the second inter-layer insulator 44 in the memory cell region 10, so that the capacitor 47 is positioned over the first plug conductor 46. The capacitor 47 comprises a storage electrode 48, a capacitive dielectric film 49 and an opposite electrode 50. The storage electrode 48 is in contact with the first plug conductor 46, so that the storage electrode 48 is electrically connected through the first plug conductor 46 to the n-⁻type source region 15, The storage electrode 48 may be made of polysilicon. The capacitive dielectric film 49 may comprise a silicon nitride film. The opposite electrode 50 may comprise a polysilicon film.

With reference to FIG. 3P, a third inter-layer insulator 51 is entirely formed by a chemical vapor deposition method over the capacitor 47 and the second inter-layer insulator 44, so that the third inter-layer insulator 51 extends over the memory cell region 10 and the logic region 20. The third inter-layer insulator 51 has a thickness in the range of 1.1–1.3 micrometers. A third contact hole 52 is formed in the first, second and third inter-layer insulators 41, 44 and 51 and in the silicon oxide film 27 over the n-+type source region 31 in the n-channel region 20N of the logic region 20, so that the third contact hole 52 is positioned over the n-+type source region 31 in the n-channel region 20N of the logic region 20, whereby a part of the surface of the n-+type source region 31 is shown through the third contact hole 52. A fourth contact hole 53 is formed in the first, second and third inter-layer insulators 41, 44 and 51 and in the silicon oxide film 27 over the n-+type drain region 32 in the n-channel region 20N of the logic region 20, so that the fourth contact hole 53 is positioned over the n-+type drain region 32 in the n-channel region 20N of the logic region 20, whereby a part of the surface of the n-+type drain region 32 is shown through the fourth contact hole 53. A fifth contact hole 54 is formed in the first, second and third inter-layer insulators 41, 44 and 51 and in the silicon oxide film 27 over the p-+type source region 38 in the p-channel region 20P of the logic region 20, so that the fifth contact hole 54 is positioned over the p-+type source region 38 in the p-channel region 20P of the logic region 20, whereby a part of the surface of the p-+type source region 38 is shown through the fifth contact hole 54. A sixth contact hole 55 is formed in the first, second and third inter-layer insulators 41, 44 and 51 and in the silicon oxide film 27 over the p-+type drain region 39 in the p-channel region 20P of the logic region 20, so that the sixth contact hole 55 is positioned over the p-+type drain region 39 in the p-channel region 20P of the logic region 20, whereby a part of the surface of the p-+type drain region 39 is shown through the sixth contact hole 55. A second plug conductor 56 is formed within the third contact hole 52, so that the second plug conductor 56 is in contact with the part of the surface of the n-+type source region 31. The second plug conductor 56 may comprise laminations of titanium/titanium nitride barrier metal films and a tungsten film. A third plug conductor 57 is formed within the fourth contact hole 53, so that the third plug conductor 57 is in contact with the part of the surface of the n-+type drain region 32. The third plug conductor 57 may comprise laminations of titanium/titanium nitride barrier metal films and a tungsten film. A fourth plug conductor 58 is formed within the fifth contact hole 54, so that the fourth plug conductor 58 is in contact with the part of the surface of the p-+type source region 38. The fourth plug conductor 58 may comprise laminations of titanium/titanium nitride barrier metal films and a tungsten film. A fifth plug conductor 59 is formed within the sixth contact hole 55, so that the fifth plug conductor 59 is in contact with the part of the surface of the p-+type drain region 39. The fifth plug conductor 59 may comprise laminations of titanium/titanium nitride barrier metal films and a tungsten film. A first interconnection 61 is formed over the third inter-layer insulator 51, so that the first interconnection 61 is in contact with the second plug conductor 56 within the third contact hole 52, whereby the first interconnection 61 is electrically connected through the second plug conductor 56 to the n-+type source region 31 in the n-channel region 20N of the logic region 20. A second interconnection 62 is formed over the third inter-layer insulator 51, so that the second interconnection 62 is in contact with the third plug conductor 57 within the fourth contact hole 53, whereby the second interconnection 62 is electrically connected through the third plug conductor 57 to the n-+type drain region 32 in the n-channel region 2ON of the logic region 20. A third interconnection 63 is formed over the third inter-layer insulator 51, so that the third interconnection 63 is in contact with the fourth plug conductor 58 within the fifth contact hole 54, whereby the third interconnection 63 is electrically connected through the fourth plug conductor 58 to the p-+type source region 38 in the p-channel region 20P of the logic region 20. A fourth interconnection 64 is formed over the third inter-layer insulator 51, so that the fourth interconnection 64 is in contact with the fifth plug conductor 59 within the sixth contact hole 55, whereby the fourth interconnection 64 is electrically connected through the fifth plug conductor 59 to the p-+type drain region 39 in the p-channel region 20P of the logic region 20. The above first to fourth interconnections 61, 62, 63 and 64 may be made of aluminum. A passivation film 65 is finally formed on the third inter-layer insulator 51 and on the first to fourth interconnections 61, 62, 63 and 64, whereby a semiconductor device is completed which has an integration of the memory cell region 10 and the logic region 20, wherein the tungsten silicide layers 40 are selectively formed only in the logic region 20.

As described above, the titanium silicide layers 40 are selectively formed without using any additional photo-mask to the first and second photo-masks 25 and 35 which have been used for the purpose of forming the n-type source and drain regions 31 and 32 in the n-channel region 20N of the logic region 20 and also forming the p-type source and drain regions 38 and 39 in the p-channel region 20P of the logic region 20. Namely, in this embodiment, the n-type source and drain regions 31 and 32 having the lightly-doped drain structures and the p-type source and drain regions 38 and 39 having the lightly-doped drain structures have been formed in the n-channel and p-channel regions 20N and 20P of the logic region 20, respectively, before the titanium film is deposited, wherein the n-type source and drain regions 31 and 32 and the p-type source and drain regions 38 and 39 are shown. It is, therefore, unnecessary to remove the gate oxide films from surfaces of the n-type source and drain regions 31 and 32 and the p-type source and drain regions 38 and 39 before the titanium film is deposited thereon. Accordingly, the silicide layers 40 are selectively formed only in the logic region 20 without, however, removing the gate oxide films by any additional photo-lithography using any photo-mask. No need to carry out any additional photo-lithography using any photo-mask allows a substantive reduction in the manufacturing cost of the semiconductor device.

In this embodiment, formations of the source and drain regions 15 and 16 in the memory cell region 10 are carried out independently. The formations of the n-channel and p-channel regions 20N and 20P arc independently formed. It is easy to optimize the memory cell region 10 and the n-channel and pchannel regions 20N and 20P of the logic region. Namely, the above processes make increased a freedom of design of the semiconductor device.

It is possible to modify the above embodiment as follows. In place of titanium, other refractory metals such as cobalt, molybdenum, tantalum chromium and tungsten may be available for selectively forming the silicide layer only on the logic region.

In place of the polycide structure of the gate electrode, a polysilicon gate electrode may be available.

It is also possible that the source and drain regions have a salicide structure.

It is also possible that the MOS field effect transistor in the memory cell region also has a lightly-doped drain stricture.

It is also possible that the capacitor is formed under the bit line in the memory cell region.

It is also possible that the single MOS field effect transistor is formed in the logic region in place of the CMOS transistors.

It is also possible to use an electron beam lithography or an X-ray lithography in place of the photo-lithography.

It is possible to use a silicon nitride film or laminations of a silicon oxide film and a silicon nitride film for the gate insulation film.

It is possible to form a metal insulator semiconductor (MIS transistor). Namely, not only the MOS field effect transistor but also a metal nitride semiconductor field effect transistor (MNS transistor) or a metal nitride oxide semiconductor field effect transistor (MNOS transistor) may be formed by use of the above novel method.

It is, of course, possible to change the conductivity types of the substrate and all of the semiconductor regions.

It is also possible to change the substances, thickness, concentration and method of deposition of the films for the insulation films and the conductive films and the semiconductor regions.

Whereas any further modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of selectively forming a silicide layer on a logic region of a semiconductor substrate which has an integration of a memory cell region and said logic region, said method comprising the steps of:

forming an insulation film over said memory cell region and said logic region;

entirely applying a resist film over said insulation film;

selectively removing said resist film over at least a predetermined part of said logic region by use of a lithography process, whereby said insulation film is shown over said logic region;

selectively etching said insulation film over said logic region by use of said resist film, whereby at least a silicon region is shown over said logic region;

removing said resist film;

entirely depositing a refractory metal layer on said insulation film over said memory cell region and also on said silicon region over said logic region;

carrying out a heat treatment to cause a silicidation reaction to form at least a silicide layer on said silicon region over said logic region; and removing an unreacted refractory metal layer from said silicon oxide film.

2. The method as claimed in claim 1, wherein said step of selectively etching said insulation film over said logic region by use of said resist film comprises an etch back by use of said resist film to form side wall insulation films on side walls of a gate electrode over said logic region.

3. The method as claimed in claim 2, wherein said at least silicon region being made shown by said etch back comprises source and drain regions having a lightly doped drain structure over said logic region.

4. The method as claimed in claim 3, wherein said source and drain regions are self-aligned by said gate electrode and said side wall insulation films, and said silicide layer has a salicide structure.

5. The method as claimed in claim 1, wherein said logic region comprises at least a first conductivity type channel region and at least a second conductivity type channel region, and said method comprising the steps of:

forming an insulation film over said memory cell region and said first conductivity type channel region and said second conductivity type channel region;

entirely applying a first resist film over said insulation film;

selectively removing said first resist film over at least a predetermined part of said first conductivity type channel region by use of a first lithography process, whereby said insulation film is shown over said first conductivity type channel region;

selectively etching said insulation film over said first conductivity type channel region by use of said first resist film, whereby at least a first silicon region is shown over said first conductivity type channel region;

removing said first resist film;

entirely applying a second resist film over said insulation film;

selectively removing said second resist film over at least a predetermined part of said second conductivity type channel region by use of a second lithography process, whereby said insulation film is shown over said second conductivity type channel region;

selectively etching said insulation film over said second conductivity type channel region by use of said second resist film, whereby at least a second silicon region is shown over said second conductivity type channel region;

removing said second resist film;

entirely depositing a refractory metal layer on said insulation film over said memory cell region and also on said first and second silicon regions over said first conductivity type channel region and said second conductivity type channel region;

carrying out a heat treatment to cause a silicidation reaction to form silicide layers on said first and second silicon regions over said first conductivity type channel region and said second conductivity type channel region; and removing an unreacted refractory metal layer from said silicon oxide film.

6. The method as claimed in claim 5, wherein said step of selectively etching said insulation film over said first conductivity type channel region by use of said first resist film comprises a first etch back process by use of said first resist film to form first side wall insulation films on side walls of a first gate electrode over said first conductivity type channel region, and said step of selectively etching said insulation film over said second conductivity type channel region by use of said second resist film comprises a second etch back process by use of said second resist film to form second side wall insulation films on side walls of a second gate electrode over said second conductivity type channel region.

7. The method as claimed in claim 6, wherein said at least first silicon region being made shown by said first etch back process comprises first source and drain regions having a lightly doped drain structure over said first conductivity type channel region, and said at least second silicon region being made shown by said second etch back process comprises second source and drain regions having a lightly doped drain structure over said second conductivity type channel region.

8. The method as claimed in claim 7, wherein said first source and drain regions are self-aligned by said first gate electrode and said first side wall insulation films, and said second source and drain regions are self-aligned by said second gate electrode and said second side wall insulation films, whereby said silicide layers have a salicide structure.

9. A method of forming a semiconductor device which has an integration of a memory cell region and a logic region having at least a silicide layer, said method comprising the steps of:

defining at least a memory cell region and at least a logic region over a silicon substrate;

forming gate insulation films on said at least memory cell region and said at least logic region;

forming a first gate electrode on said gate insulation film over said memory cell region and a second gate electrode on said gate insulation film over said at least logic region;

selectively forming first lightly doped regions in said memory cell region in a self-alignment technique by using said first gate electrode as a mask, and also selectively forming second lightly doped regions in said logic region in a self-alignment technique by using said second gate electrode as a mask;

entirely forming an insulation film over said at least memory cell region and said at least logic region;

entirely applying a resist film over said insulation film;

selectively removing said resist film over at least a predetermined part of said logic region by use of a lithography process, whereby said insulation film is shown over said logic region;

subjecting said insulation film over said logic region to an etch-back process by use of said resist film, whereby side wall insulation films are formed on side walls of said second gate electrode over said logic region and said second lightly doped regions are shown over said logic region;

selectively forming source and drain regions having a lightly-doped drain structure in said logic regions in a self-alignment technique using said resist film and said second gate electrode as masks;

removing said resist film;

entirely depositing a refractory metal layer on said insulation film over said memory cell region and also on said source and drain regions over said logic region;

carrying out a heat treatment to cause a silicidation reaction to form silicide layers on said source and drain regions over said logic region; and removing an unreacted refractory metal layer from said silicon oxide film.

10. The method as claimed in claim 9, wherein said logic region comprises at least a first conductivity type channel region and at least a second conductivity type channel region, and said method comprising the steps of:

defining said memory cell region and a fist conductivity type channel region and a second conductivity type channel region of said logic region over a silicon substrate;

forming gate insulation films on said memory cell region and said first conductivity type channel region and said second conductivity type channel region;

forming a first gate electrode on said gate insulation film over said memory cell region and a second gate electrode on said gate insulation film over said first conductivity type channel region and a third gate electrode on said gate insulation film over said second conductivity type channel region;

selectively forming first lightly doped regions in said memory cell region in a self-alignment technique by using said first gate electrode as a mask, and also selectively forming second lightly doped regions in said first conductivity type channel region in a self-alignment technique by using said second gate electrode as a mask, and also selectively forming third lightly doped regions in said second conductivity type channel region in a self-alignment technique by using said third gate electrode as a mask;

entirely forming an insulation film over said at least memory cell region and said first conductivity type channel region and said second conductivity type channel region;

entirely applying a first resist film over said insulation film;

selectively removing said first resist film over at least a predetermined part of said first conductivity type channel region by use of a first lithography process, whereby said insulation film is shown over said first conductivity type channel region;

subjecting said insulation film over said first conductivity type channel region to a first etch-back process by use of said first resist film, whereby first side wall insulation films are formed on side walls of said second gate electrode, and said second lightly doped regions are shown over said first conductivity type channel region;

selectively forming first source and drain regions having a lightly-doped drain structure in said first conductivity type channel region in a self-alignment technique using said first resist film and said second gate electrode as masks;

removing said first resist film;

entirely applying a second resist film over said insulation film;

selectively removing said second resist film over at least a predetermined part of said second conductivity type channel region by use of a second lithography process, whereby said insulation film is shown over said second conductivity type channel region;

subjecting said insulation film over said second conductivity type channel region to a second etch-back process by use of said second resist film, whereby second side wall insulation films are formed on side walls of said third gate electrode, and said third lightly doped regions are shown over said second conductivity type channel region;

selectively forming second source and drain regions having a lightly-doped drain structure in said second conductivity type channel region in a self-alignment technique using said second resist film and said third gate electrode as masks;

removing said second resist film;

entirely depositing a refractory metal layer on said insulation film over said memory cell region and also on said first and second source and drain regions over said first conductivity type channel region and said second conductivity type channel region;

carrying out a heat treatment to cause a silicidation reaction to form silicide layers on said first and second source and drain regions over said first conductivity type channel region and said second conductivity type channel region; and removing an unreacted refractory metal layer from said silicon oxide film.

* * * * *